(12) United States Patent
Jasper et al.

(10) Patent No.: US 6,882,405 B2
(45) Date of Patent: Apr. 19, 2005

(54) OFF-AXIS LEVELLING IN LITHOGRAPHIC PROJECTION APPARATUS

(75) Inventors: Johannes Christiaan Maria Jasper, Veldhoven (NL); Theodorus M Modderman, Nuenen (NL); Gerrit Johannes Nijmeijer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/686,641

(22) Filed: Oct. 17, 2003

(65) Prior Publication Data

US 2004/0080737 A1 Apr. 29, 2004

Related U.S. Application Data

(63) Continuation of application No. 09/519,875, filed on Mar. 6, 2000, now Pat. No. 6,674,510.

(30) Foreign Application Priority Data

Mar. 8, 1999 (EP) .............................. 99200649

(51) Int. Cl.[7] .................. G03B 27/52; G03B 27/42; G03B 27/32
(52) U.S. Cl. .............................. 355/55; 355/53; 355/77
(58) Field of Search ............................. 430/30; 355/55, 355/53, 77; 356/399, 400, 401; 310/12; 250/548

(56) References Cited

U.S. PATENT DOCUMENTS

| 4,475,223 A | 10/1984 | Taniguchi et al. |
| 4,540,277 A | 9/1985 | Mayer |
| 4,999,669 A | 3/1991 | Sakamoto et al. |
| 5,144,363 A | 9/1992 | Wittekoek |
| 5,191,200 A | 3/1993 | van der Werf |
| 5,416,562 A | 5/1995 | Ota et al. |
| 5,715,064 A | 2/1998 | Lin |
| 5,748,323 A | 5/1998 | Levinson |
| 5,917,580 A | 6/1999 | Ebinuma et al. |
| 5,969,441 A | 10/1999 | Loopstra et al. |
| 6,208,407 B1 | 3/2001 | Loopstra |
| 6,498,351 B1 | 12/2002 | Kruizinga |
| 2001/0013936 A1 | 8/2001 | Nielsen et al. |

FOREIGN PATENT DOCUMENTS

| EP | 0467445 | 1/1992 |
| EP | WO 98/39689 | 9/1998 |
| EP | WO 99/28790 | 6/1999 |
| EP | WO 99/32940 | 7/1999 |
| EP | 0951054 | 10/1999 |
| JP | 61196532 | 8/1986 |
| JP | 4179115 | 6/1992 |

*Primary Examiner*—Peter B. Kim
(74) *Attorney, Agent, or Firm*—Pillsbury Winthrop LLP

(57) ABSTRACT

In an off-axis levelling procedure a height map of the substrate is generated at a measurement station. The height map is referenced to a physical reference surface of the substrate table. The physical reference surface may be a surface in which is inset a transmission image sensor. At the exposure station the height of the physical reference surface is measured and related to the focal plane of the projection lens. The height map can then be used to determine the optimum height and/or tilt of substrate table to position the exposure area on the substrate in best focus during exposure. The same principles can be applied to (reflective) masks.

10 Claims, 9 Drawing Sheets

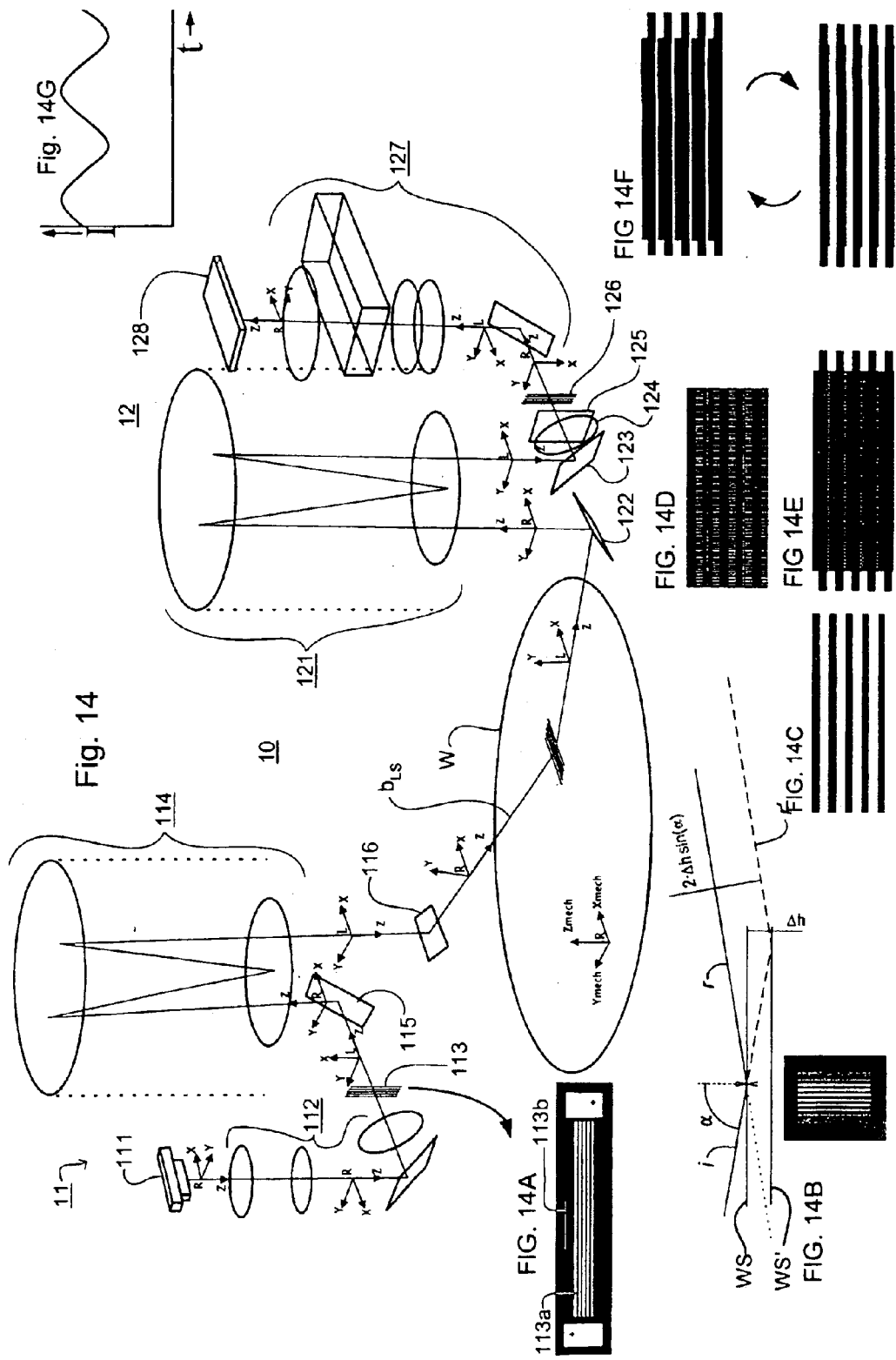

US 6,882,405 B2

OFF-AXIS LEVELLING IN LITHOGRAPHIC PROJECTION APPARATUS

This is a continuation application of U.S. application Ser. No. 09/519,875, filed Mar. 6, 2000, now U.S. Pat. No. 6,674,510, which claims priority from European Patent application No. 99200649.4, filed Mar. 8, 1999, the entire contents of which are hereby incorporated by reference.

BACKGROUND OF THE INVENTION

The present invention relates to height detection and levelling, for example of the substrate and/or mask, in lithographic apparatus. More particularly, the invention relates to a system for off-axis levelling in lithographic projection apparatus comprising:
 a radiation system for supplying a projection beam of radiation;
 a first object table provided with a mask holder for holding a mask;
 a second, movable object table provided with a substrate holder for holding a substrate;
 a projection system for imaging an irradiated portion of the mask onto a target portion of the substrate; and
 a positioning system for moving said second object table between an exposure position, at which said projection system can image said mask portion onto said substrate, and a measurement position.

SUMMARY OF THE INVENTION

For the sake of simplicity, the projection system may hereinafter be referred to as the "lens"; however, this term should be broadly interpreted as encompassing various types of projection systems, including refractive optics, reflective optics, catadioptric systems, and charged particle optics, for example. The radiation system may also include elements operating according to any of these principles for directing, shaping or controlling the projection beam, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more tables while one or more other tables are being used for exposures.

Lithographic projection apparatus can be used, for example, in the manufacture of integrated circuits (ICs). In such a case, the mask (reticle) may contain a circuit pattern corresponding to an individual layer of the IC, and this pattern can be imaged onto an exposure area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatus, each die is irradiated by exposing the entire reticle pattern onto the die at once; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally <1), the speed V at which the wafer table is scanned will be a factor M times that at which the reticle table is scanned. More information with regard to lithographic devices as here described can be gleaned from International Patent Application WO 97/33205, for example.

Until very recently, lithographic apparatus contained a single mask table and a single substrate table. However, machines are now becoming available in which there are at least two independently moveable substrate tables; see, for example, the multi-stage apparatus described in International Patent Applications WO98/28665 and WO98/40791. The basic operating principle behind such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and measurement positions.

The measurements performed on the substrate at the measurement position may, for example, include a determination of the spatial relationship (in X & Y directions) between various contemplated exposure areas on the substrate ("dies"), reference markers on the substrate and at least one reference marker (e.g. fiducial) located on the substrate table outside the area of the substrate. Such information can subsequently be employed at the exposure position to perform a fast and accurate X and Y positioning of the exposure areas with respect to the projection beam; for more information see WO 99/32940 (P-0079), for example. This document also describes the preparation at the measurement position of a height map relating the Z position of the substrate surface at various points to a reference plane of the substrate holder. However the reference plane is defined by a Z-interferometer at the measurement position and a different Z-interferometer is used at the exposure position. It is therefore necessary to know accurately the relationship between the origins of the two Z-interferometers.

An object of the present invention is to provide a system for off-axis levelling a substrate in a lithographic projection apparatus that avoids the need to relate the origins of two interferometer systems and enables additional improvements in positioning of the exposure areas during exposure processes.

According to the present invention there is provided a lithographic projection apparatus comprising:
 a radiation system for supplying a projection beam of radiation;
 a first object table provided with a mask holder for holding a mask;
 a second, movable object table provided with a substrate holder for holding a substrate;
 a projection system for imaging an irradiated portion of the mask onto a target portion of the substrate; and
 a positioning system for moving said second object table between an exposure station, at which said projection system can image said mask portion onto said substrate, and a measurement station; characterized in that said second object table has a physical reference surface fixed thereto;

and by:

height mapping means located at said measurement station and constructed and arranged to measure the height, relative to said physical reference surface, of a plurality of points on the surface of a substrate held on said substrate holder and to create a height map thereof;

position measuring means located at said exposure station for measuring the position of said physical reference surface in a first direction substantially perpendicular to said substrate surface, after movement of said second object table to said exposure station; and control means constructed and arranged to control the position of said second object table in at least said first direction, during exposure of said target portion, in accordance with said height map and said position measured by said position measuring means.

According to a further aspect of the present invention there is provided a method of manufacturing a device using a lithographic projection apparatus comprising:

a radiation system for supplying a projection beam of radiation;

a first object table provided with a mask holder for holding a mask;

a second, movable object table provided with a substrate holder for holding a substrate; and a projection system for imaging irradiated portions of the mask onto target portions of the substrate at an exposure station; the method comprising the steps of:

providing a mask bearing a pattern to said first object table;

providing a substrate having a radiation-sensitive layer to said second object table; and imaging said irradiated portions of the mask onto said target portions of the substrate; characterized by the steps of:

before said step of imaging, generating, with the second object table at a measurement station, a height map indicating the height of a plurality of points on the substrate surface relative to a physical reference surface on said second object table;

moving the second object table to said exposure station and measuring the position of said physical reference surface in a first direction substantially perpendicular to said substrate surface; and during said step of imaging, positioning the second object table in at least said first direction by reference to said height map and said measured position in said first direction of said physical reference surface.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array, of devices (dies) will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "exposure area", respectively.

In the present document, the terms "radiation" and "beam" are used to encompass all types of electromagnetic radiation or particle flux, including, but not limited to, ultraviolet radiation (e.g. at a wavelength of 365 nm, 248 nm, 193 nm, 157 nm or 126 nm), extreme ultraviolet radiation (EUV), X-rays, electrons and ions. Also herein, the invention is described using a reference system of orthogonal X, Y and Z directions and rotation about an axis parallel to the I direction is denoted Ri. Further, unless the context otherwise requires, the term "vertical" (Z) used herein is intended to refer to the direction normal to the substrate or mask surface, rather than implying any particular orientation of the apparatus.

BRIEF DESCRIPTION OF THE DRAWINGS

The present invention will be described below with reference to exemplary embodiments and the accompanying schematic drawings, in which:

FIG. 14 and its sub-FIGS. A to G illustrate the structure and operation of a presently preferred embodiment of a level sensor usable in the invention;

In the drawings, like references indicate like parts.

DETAILED DESCRIPTION OF VARIOUS EXEMPLARY EMBODIMENTS OF THE INVENTION

EMBODIMENT 1

Figure 1:
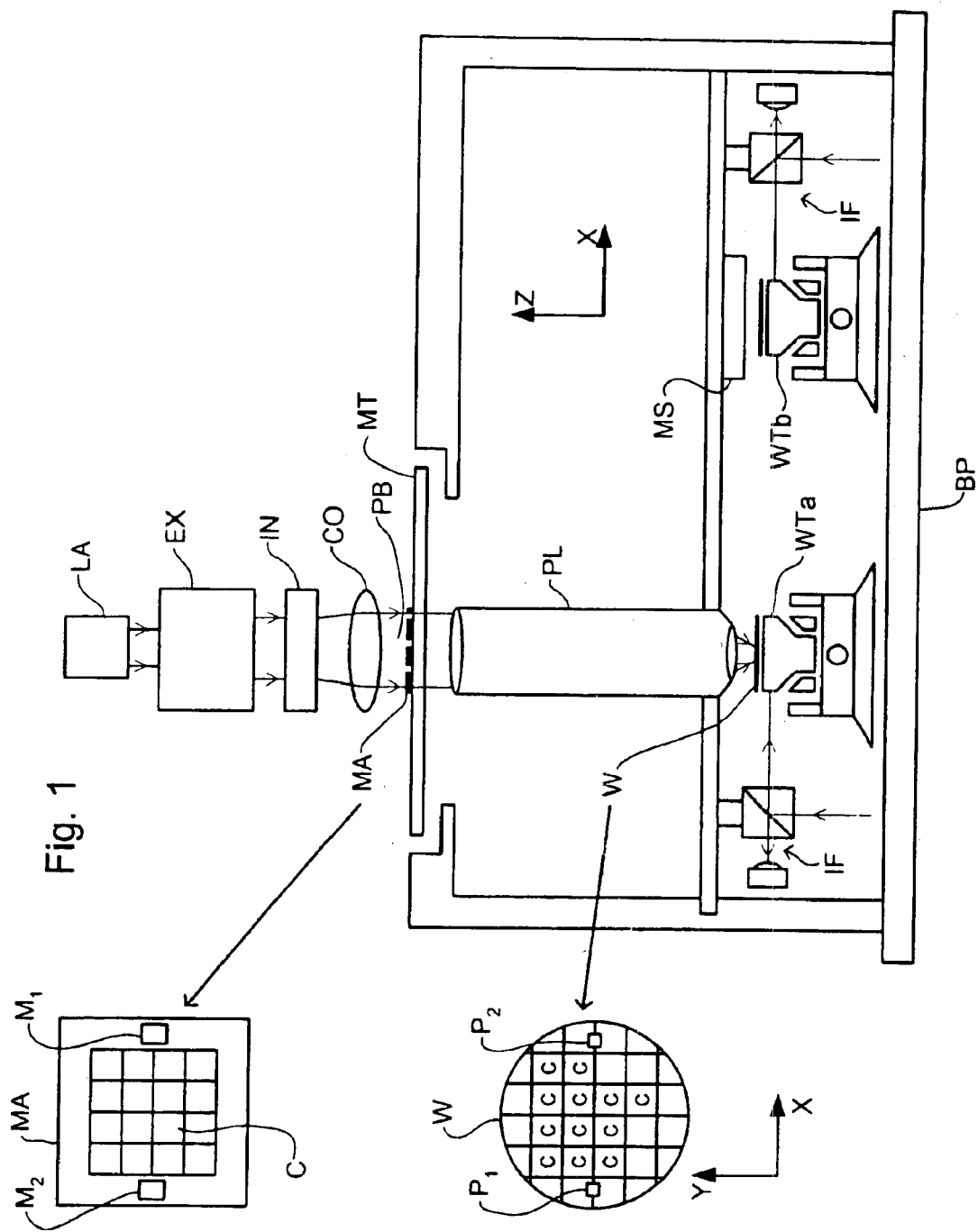
FIG. 1 depicts a lithographic projection apparatus according to a first embodiment of the invention.

FIG. 1 schematically depicts a lithographic projection apparatus according to the invention. The apparatus comprises:

a radiation system LA, Ex, IN, CO for supplying a projection beam PB of radiation (e.g. UV or EUV radiation);

a first object table (mask table) MT provided with a mask holder for holding a mask MA (e.g. a reticle), and connected to first positioning means for accurately positioning the mask with respect to item PL;

a second object table (substrate or wafer table) WTa provided with a substrate holder for holding a substrate W (e.g. a resist-coated silicon wafer), and connected to second positioning means for accurately positioning the substrate with respect to item PL;

a third object table (substrate or wafer table) WTb provided with a substrate holder for holding a substrate W (e.g. a resist-coated silicon wafer), and connected to third positioning means for accurately positioning the substrate with respect to item PL;

a measurement system MS for performing measurement (characterization) processes on a substrate held on a substrate table WTa or WTb at a measurement station;

a projection system ("lens") PL (e.g. a refractive or catadioptric system, a mirror group or an array of field deflectors) for imaging an irradiated portion of the mask MA onto an exposure area C (die) of a substrate W held in a substrate table WTa or WTb at an exposure station.

As here depicted, the apparatus is of a transmissive type (i.e. has a transmissive mask). However, in general, it may also be of a reflective type, for example.

The radiation system comprises a source LA (e.g. a Hg lamp, examiner laser, an undulator provided around the path of an electron beam in a storage ring or synchrotron, a laser plasma source or an electron or ion beam source) which produces a beam of radiation. This beam is passed along various optical components comprised in the illumination system,—e.g. beam shaping optics Ex, an integrator IN and a condenser CO—so that the resultant beam PB has a desired shape and intensity distribution in its cross-section.

The beam PB subsequently intercepts the mask MA which is held in a mask holder on a mask table MT. Having passed through the mask MA, the beam PB passes through the lens PL, which focuses the beam PB onto an exposure area C of the substrate W. With the aid of the interferometric displacement and measuring means IF, the substrate tables WTa, WTb can be moved accurately by the second and third positioning means, e.g. so as to position different exposure areas C, in the path of the beam PB. Similarly, the first positioning means can be used to accurately position the mask MA with respect to the path of the beam PB, e.g. after mechanical retrieval of the mask MA from a mask library. In general, movement of the object tables MT, WTa, WTb will be realized with the aid of a long stroke module (course positioning) and a short stroke module (fine positioning), which are not explicitly depicted in FIG. 1. In the case of a waferstepper (as opposed to a step-and-scan apparatus) the reticle table may be connected only to a short stroke positioning device, to make fine adjustments in mask orientation and position.

The second and third positioning means may be constructed so as to be able to position their respective substrate tables WTa, WTb over a range encompassing both the exposure station under projection system PL and the measurement station under the measurement system MS. Alternatively, the second and third positioning means may be replaced by separate exposure station and measurement station positioning systems for positioning a substrate table in the respective exposure stations and a table exchange means for exchanging the substrate tables between the two positioning systems. Suitable positioning systems are described, inter alia, in WO 98/28665 and WO 98/40791 mentioned above. It should be noted that a lithography apparatus may have multiple exposure stations and/or multiple measurement stations and that the numbers of measurement and exposure stations may be different than each other and the total number of stations need not equal the number of substrate tables. Indeed, the principle of separate exposure and measurement stations may be employed even with a single substrate table.

The depicted apparatus can be used in two different modes:

1. In step-and-repeat (step) mode, the mask table MT is kept essentially stationary, and an entire mask image is projected at once (i.e. a single "flash") onto an exposure area C. The substrate table WT is then shifted in the X and/or Y directions so that a different exposure area C can be irradiated by the beam PB;

2. In step-and-scan (scan) mode, essentially the same scenario applies, except that a given exposure area C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WTa or WTb is moved in the same or opposite direction at a speed V=Mv, in which M is the magnification of the lens PL (typically, M=¼ or ⅕). In this manner, a relatively large exposure area C can be exposed, without having to compromise on resolution.

An important factor influencing the imaging quality of a lithographic apparatus is the accuracy with which the mask image is focused on the substrate. In practice, since the scope for adjusting the position of the focal plane of the projection system PL is limited and the depth of focus of that system is small, this means that the exposure area of the wafer (substrate) must be positioned precisely in the focal plane of the projection system PL. To do this, it is of course necessary to know both the position of the focal plane of the projection system PL and the position of the top surface of the wafer. Wafers are polished to a very high degree of flatness but nevertheless deviation of the wafer surface from perfect flatness (referred to as "unflatness") of sufficient magnitude noticeably to affect focus accuracy can occur. Unflatness may be caused, for example, by variations in wafer thickness, distortion of the shape of the wafer or contaminants on the wafer holder. The presence of structures due to previous process steps also significantly affects the wafer height (flatness). In the present invention, the cause of unflatness is largely irrelevant; only the height of the top surface of the wafer is considered. Unless the context otherwise requires, references below to "the wafer surface" refer to the top surface of the wafer onto which will be projected the mask image.

Figure 2:
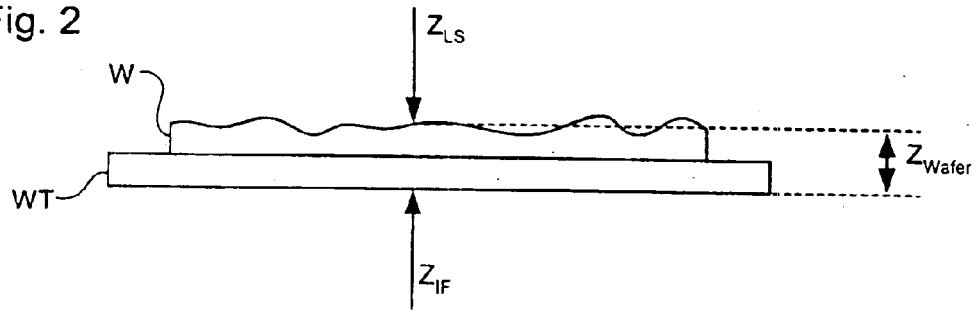
FIG. 2 is a view showing how the wafer height is determined from measurements by the level sensor and the Z-interferometer.

According to the invention, after loading a wafer onto the substrate table, the height of the wafer surface $Z_{Wafer}$ relative to a physical reference surface of the substrate table is mapped. This process is carried out at the measurement station using a first sensor, referred to as the level sensor, which measures the vertical (Z) position of the physical reference surface and the vertical position of the wafer surface, $Z_{LS}$, at a plurality of points, and a second sensor, for example a Z-interferometer, which simultaneously measures the vertical position of the substrate table, $Z_{IF}$ at the same points. As shown in FIG. 2, the wafer surface height is determined as $Z_{Wafer}=Z_{LS}-Z_{IF}$. The substrate table carrying the wafer is then transferred to the exposure station and the vertical position of the physical reference surface is again determined. The height map is then referred to in positioning the wafer at the correct vertical position during the exposure process. This procedure is described in more detail below with reference to FIGS. 3 to 6.

Figure 3:
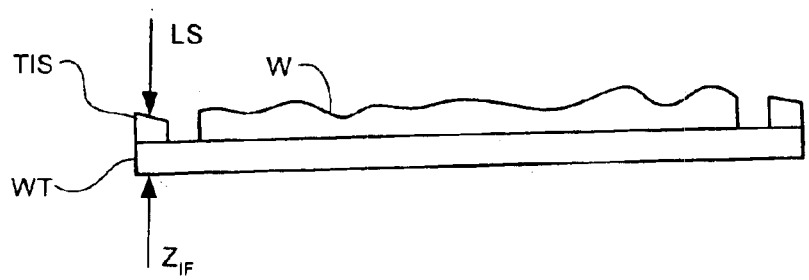
FIGS. 3 to 6 are views showing various steps of the off-axis levelling procedure according to the present invention.

As shown in FIG. 3, first the substrate table is moved so that a physical reference surface fixed to the substrate table is underneath the level sensor LS. The physical reference surface may be any convenient surface whose position in X, Y and Z on the substrate table will not change during processing of a wafer in the lithographic apparatus and, most importantly, in the transfer of the substrate table between measurement and exposure stations. The physical reference surface may be part of a fiducial containing other alignment markers and should have such properties as allow its vertical position to be measured by the same sensor as measures the vertical position of the wafer surface. In a presently preferred embodiment the physical reference surface is a reflective surface in a fiducial in which is inset a so-called transmission image sensor (TIS). The TIS is described further below.

The level sensor may be, for example, an optical sensor such as that described in U.S. Pat. No. 5,191,200 (P-0039) (referred to therein as a focus error detection system); alternatively, a pneumatic or capacitive sensor (for example) is conceivable. A presently preferred form of sensor making use of Moiré patterns formed between the image of a projection grating reflected by the wafer surface and a fixed detection grating is described below in relation to a second embodiment of the invention. The level sensor may measure the vertical position of a plurality of positions simultaneously and for each may measure the average height of a small area, so averaging out unflatnesses of high spatial frequencies.

Simultaneously with the measurement of the vertical position of a physical reference surface by the level sensor LS, the vertical position of the substrate table is measured using the Z-interferometer, $Z_{IF}$. The Z-interferometer may, for example, be part of a three, five or six-axis interferometric metrology system such as that described in WO 99/28790 (P-0077) or WO 99/32940 (P-0079). The Z-interferometer system preferably measures the vertical position of the substrate table at a point having the same position in the XY plane as the calibrated measurement position of the level sensor LS. This may be done by measuring the vertical position of two opposite sides of the substrate table WT at points in line with the measurement position of the level sensor and interpolating/modelling between them. This ensures that, in the event that the wafer table is tilted out of the XY plane, the Z-interferometer measurement correctly indicates the vertical position of the substrate table under the level sensor.

Preferably, this process is repeated with at least a second physical reference surface spaced apart, e.g. diagonally, from the first physical reference surface. Height measurements from two or more positions can then be used to define a reference plane.

The simultaneous measurement of the vertical position of one or more physical reference surfaces and the vertical position of the substrate table establishes a point or points determining the reference plane relative to which the wafer height is to be mapped. A Z-interferometer of the type mentioned above is effectively a displacement sensor rather than an absolute sensor, and so requires zeroing, but provides a highly linear position measurement over a wide range. On the other hand, suitable level sensors, e.g. those mentioned above, may provide an absolute position measurement with respect to an externally defined reference plane (i.e. nominal zero) but over a smaller range. Where such sensors are used, it is convenient to move the substrate table vertically under the level sensor until the physical reference surface(s) is (are) positioned at a nominal zero in the middle of the measurement range of the level sensor and to read out the current interferometer Z value. One or more of these measurements on physical reference surfaces will establish the reference plane for the height mapping. The Z-interferometer is then zeroed with reference to the reference plane. In this way the reference plane is related to the physical surface on the substrate table and the $Z_{Wafer}$ height map is made independent of the initial zero position of the Z-interferometer at the measurement station and other local factors such as any unflatness in the base plate over which the substrate table is moved. Additionally, the height map is made independent of any drift in the zero position of the level sensor.

Figure 4:
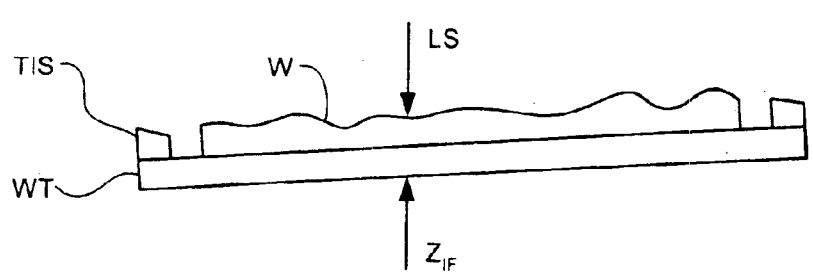

As illustrated in FIG. 4, once the reference plane has been established, the substrate table is moved so that the wafer surface is scanned underneath the level sensor to make the height map. The vertical position of the wafer surface and the vertical position of the substrate table are measured at a plurality of points of known XY position and subtracted from each other to give the wafer height at the known XY positions. These wafer height values form the wafer height map which can be recorded in any suitable form. For example, the wafer height values and XY coordinates may be stored together in so-called indivisible pairs. Alternatively, the points at which wafer height values are taken may be predetermined, e.g. by scanning the wafer along a predetermined path at a predetermined speed and making measurements at predetermined intervals, so that a simple list or array of height values (optionally together with a small number of parameters defining the measurement pattern and/or a starting point) may suffice to define the height map.

The motion of the substrate table during the height mapping scan is largely only in the XY plane. However, if the level sensor LS is of a type which only gives a reliable zero reading, the substrate table is also moved vertically to keep the wafer surface at the zero position of the level sensor. The wafer height is then essentially derived from the Z movements of the substrate table, as measured by the Z-interferometer, necessary to maintain a zero readout from the level sensor. However, it is preferable to use a level sensor that has an appreciable measurement range over which its output is linearly related to wafer height, or can be linearized. Such measurement range ideally encompasses the maximum expected, or permissible, variation in wafer height. With such a sensor, the need for vertical movement of the substrate table during the scan is reduced or eliminated and the scan can be completed faster, since the scan speed is then limited by the sensor response time rather than by the ability of the short stroke substrate table to track the contour of the wafer in three dimensions. Also, a sensor with an appreciable linear range can allow the heights at a plurality of positions (e.g. an array of spots) to be measured simultaneously.

Figure 5:
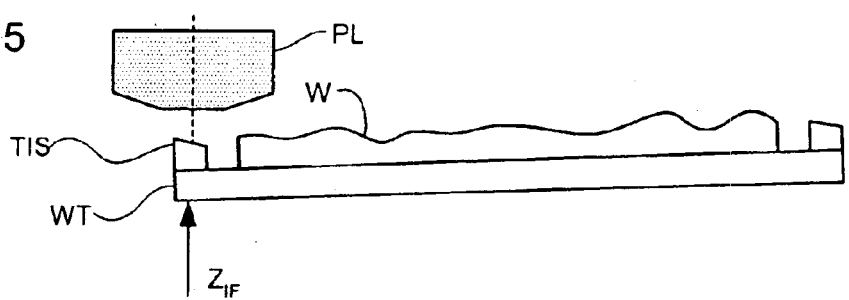

Next, the wafer table is moved to the exposure station and, as shown in FIG. 5, the (physical) reference surface is positioned under the projection lens so as to allow a measurement of its vertical position relative to the focal plane of the projection lens. In a preferred embodiment, this is achieved using one or more transmission image sensors (described below) whose detector is physically connected to the reference surface used in the earlier measurements. The transmission image sensor(s) can determine the vertical focus position of the projected image from the mask under the projection lens. Armed with this measurement, the reference plane can be related to the focal plane of the projection lens and a path for the substrate table in three-dimensions which keeps the wafer surface in optimum focus can be determined. One method by which this can be done is to calculate Z, Rx and Ry setpoints for a series of points along the scan path. The setpoints are determined using a least squares method so as to minimize the difference between the wafer map data and the focus plane of the exposure slit image. For ease of calculation, the relative motion of the exposure slit image and wafer can be expressed as the slit moving relative to a static wafer. The least squares criterion can then be expressed as, for each time t, finding the values Z(t), Rx(t) and Ry(t) which give a minimum value of:

$$LSQ(t) = \frac{1}{s}\frac{1}{w}\int_{-s/2}^{s/2}\int_{-w/2}^{w/2}[w(x,y) - (Z(t) + x \cdot Ry(t) - y \cdot Rx(t))]^2 dxdy \quad (1)$$

where w(x,y) is the wafer height map and the exposure slit image is a rectangular plane of width s in the scanning direction and length W perpendicular to the scanning direction with its position defined by z(t), Rx(t) and Ry(t). The setpoints and the wafer trajectory can be expressed as functions of either Y (position in the scanning direction) or t (time) since these are related by $Y=y_0+v \cdot t$, where $y_0$ is the starting position and v is the scanning speed.

Figure 7:
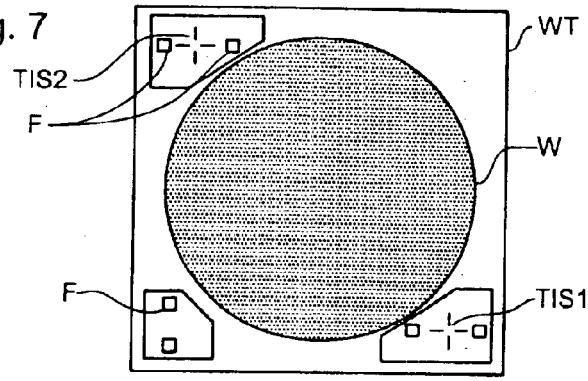
FIG. 7 is a plan view of a substrate table showing the sensors and fiducials used in the off-axis levelling procedure according to the present invention.

As mentioned above, the physical reference surface(s) is (are) preferably a surface in which a transmission image sensor (TIS) is inset. As shown in FIG. 7, two sensors TIS1 and TIS2 are mounted on a fiducial plate mounted to the top surface of the substrate table (WT, WTa or WTb), at diagonally opposite positions outside the area covered by the wafer W. The fiducial plate is made of a highly stable material with a very low coefficient of thermal expansion, e.g. Invar, and has a flat reflective upper surface which may carry markers used in alignment processes. TIS1 and TIS2 are sensors used to determine directly the vertical (and horizontal) position of the aerial image of the projection lens. They comprise apertures in the respective surface close behind which is placed a photodetector sensitive to the radiation used for the exposure process. To determine the position of the focal plane, the projection lens projects into space an image of a TIS pattern TIS-M provided on the mask MA and having contrasting light and dark regions. The substrate stage is then scanned horizontally (in one or preferably two directions) and vertically so that the aperture of the TIS, passes through the space where the aerial image is expected to be. As the TIS aperture passes through the light and dark portions of the image of the TIS pattern, the output of the photodetector will fluctuate. The vertical level at which the rate of change of amplitude of the photodetector output is highest indicates the level at which the image of TIS pattern has the greatest contrast and hence indicates the plane of optimum focus. An example of a TIS of this type is described in greater detail in U.S. Pat. No. 4,540,277. Instead of the TIS, a Reflection Image Sensor (RIS) such as that described in U.S. Pat. No. 5,144,363 may also be used.

Figure 6:
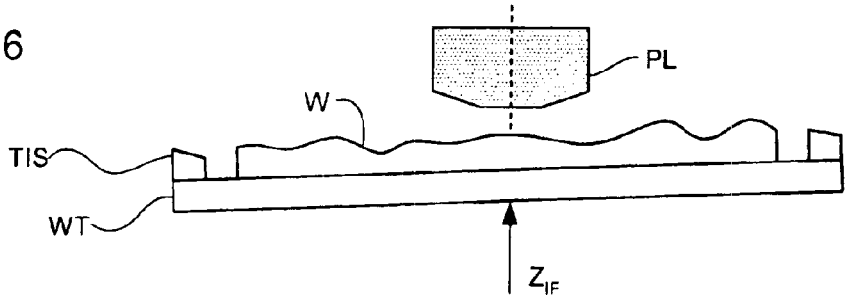

Using the surface of the TIS as the physical reference surface has the advantage that the TIS measurement directly relates the reference plane used for the height map to the focal plane of the projection lens and so the height map can be employed directly to give height corrections for the wafer stage during the exposure process. This is illustrated in FIG. 6, which shows the substrate table WT as positioned under the control of the Z-interferometer at a height determined by the height map so that the wafer surface is at the correct position under the projection lens PL.

The TIS surface may additionally carry reference markers whose position is detected using a through-the-lens (TTL) alignment system to align the substrate table to the mask. Such an alignment system is described in EP-0,467,445 A (P-0032), for example. Alignment of individual exposure areas can also be carried out, or may be obviated by an alignment procedure carried out at the measurement stage to align the exposure areas to the reference markers on the wafer stage. Such a procedure is described in EP-0 906 590 A (P-0070) for example.

It will be appreciated that the mask image projected by the projection system PL in a production process, in both step-and-repeat and step-and-scan modes, is not a single point but extends over a significant area in the XY plane. Since the wafer height may vary significantly over this area it is desirable to optimize the focus over the whole of the projection area, rather than just at a single point. In embodiments of the present invention, this can be achieved by controlling not only the vertical position of the substrate table WT, but also its tilt about the X and Y axes (Rx, Ry). With knowledge of the location and extent of the intended exposure areas, the height map generated by the present invention can be used to calculate in advance optimum Z, Rx and Ry position setpoints for the substrate table for each exposure. This avoids the time required for levelling in known apparatus that only measure wafer height when the wafer is positioned under the projection lens and hence increases throughput. The optimum Z, Rx and Ry setpoints may be calculated by various known mathematical techniques, for example using an iterative process to minimize defocus (defined as the distance between the wafer surface and the ideal focal plane), LSQ (t), integrated over the exposure area.

A further advantage is possible in the step-and-scan mode. In this mode, the projection lens projects an image of only part of the mask pattern onto a corresponding part of the exposure area. The mask and substrate are then scanned in synchronism through the object and image focal planes of the projection system PL so that the entire mask pattern is imaged onto the whole exposure area. Although in practice the projection lens is held stationary and the mask and substrate are moved, it is often convenient to consider this process in terms of an image slit moving over the wafer surface. With the height map determined in advance by the present invention, it is possible to calculate a sequence of Z, Rx and Ry setpoints matched to the XY scan path (usually, scanning takes place in only one direction, e.g. Y). The sequence of setpoints can be optimized according to additional criteria, e.g. to minimize vertical accelerations or tilt motions that might reduce throughput or induce undesirable vibrations. Given a sequence of spaced-apart setpoints, a scanning trajectory for the exposure can be calculated using a polynomial or spline fitting procedure.

Whilst the present invention aims to position the wafer at the optimum position in Z, Rx and Ry for a given exposure, the variations in wafer surface height over the exposure area may be such that the wafer cannot be positioned to give adequate focus over the entire area. Such so-called focus spots can result in an exposure failure. However, with the present invention such failures can be predicted in advance and remedial action can be taken. For example, the wafer may be stripped and recoated without the detrimental effect of further processing a badly exposed wafer. Alternatively, if the predicted failure affects only one or a few devices on the wafer while others will be acceptable, throughput may be enhanced by skipping exposures that can be predicted in advance to result in defective devices.

A further advantage of focus-spot detection can be derived from analysis of height maps taken. When large deviations from a global wafer plane are present in a wafer height map, this could indicate focus spots due to substrate unflatness or process influences. Comparing wafer height maps from several wafers can indicate focus spots due to contamination or unflatness of the substrate table. When focus spots appear at identical or near-identical positions for different wafers, this is most likely caused by substrate holder contamination (so-called "chuck-spots"). From one wafer height map, one can also compare the height map (topology) from repeated exposure areas (dies). If large differences occur at certain dies with respect to an average height map, one can suspect focus spots due to either wafer processing or the substrate table. Instead of comparing wafer height maps, the same comparisons can also be done on the derived exposure paths per die, or on the defocus parameters MA, MSD or Moving Focus explained below. When a certain die or wafer deviates much from an average exposure path or defocus parameters, focus spots can also be detected.

All of the above mentioned analysis can be done before a wafer is exposed, and remedial action, such as wafer rejection (processing influences) or substrate holder cleaning (chuck spots), can be taken. With these methods, focus spots can be localised to the size of the measurement spot of the level sensor 10. This implies a much higher resolution than previous methods of focus spot detection.

EMBODIMENT 2

Figure 8:
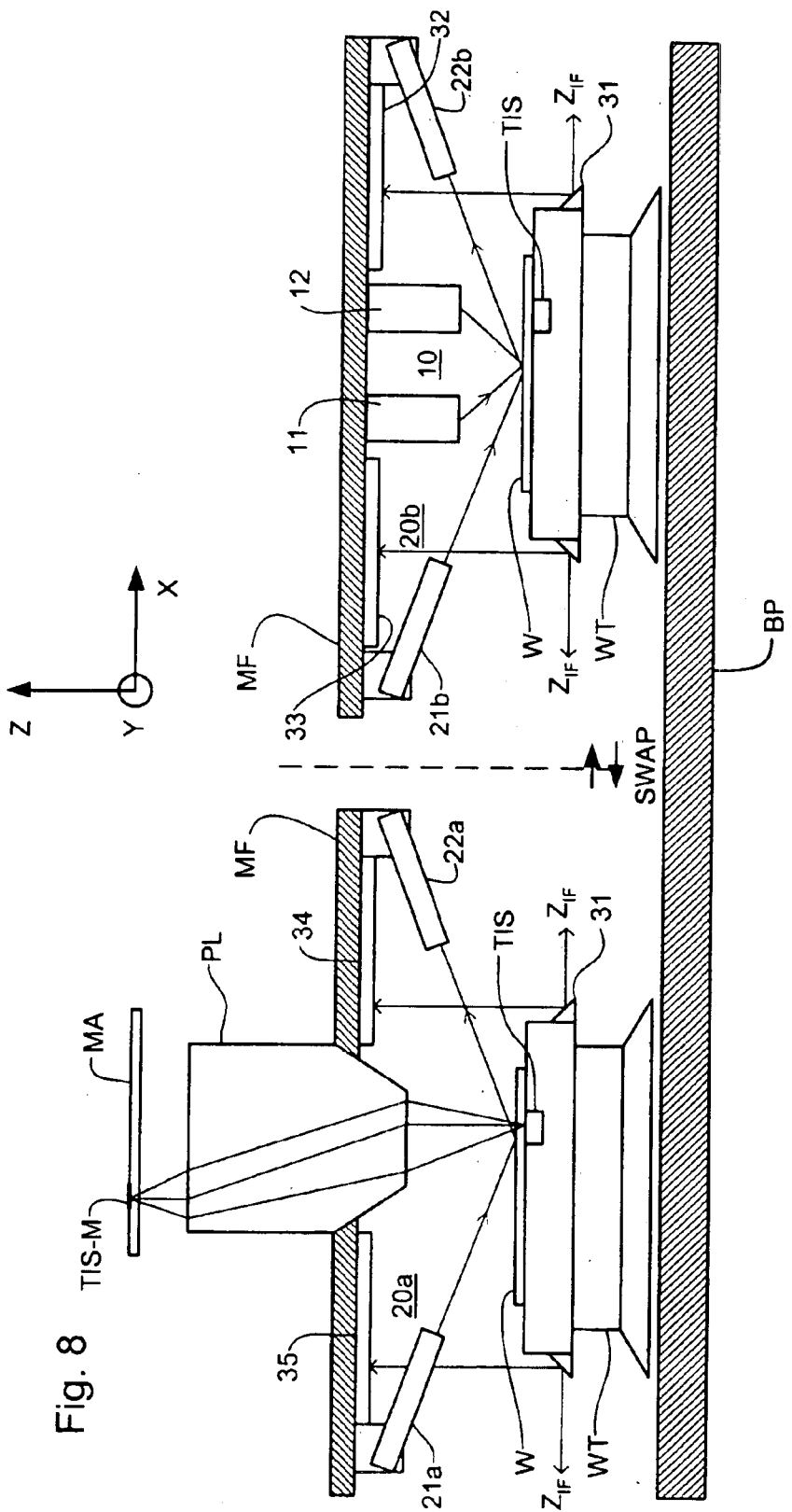
FIG. 8 is a side view of the exposure and measurement stations in a second embodiment of the invention.

A second embodiment of the present invention is shown in FIG. 8, which shows only the exposure and measurement stations and only components relevant to the discussion below. The second embodiment utilizes the levelling principle of the present invention described above, together with certain refinements described below.

At the exposure station, to the left of FIG. 8, the projection lens PL is shown mounted to metrology frame MF and projecting an image of TIS marker TIS-M on mask MA onto the sensor TIS mounted to wafer table WT. The metrology frame is isolated from the transmission of vibrations from other parts of the apparatus and has mounted on it only passive components used for fine metrology and alignment sensing. The whole metrology frame may be made of a material with a very low coefficient of thermal expansion, such as Invar, so that it provides a very stable platform for the most sensitive measuring devices of the apparatus. The components mounted on the metrology frame MF include mirrors 34 and 35 to which the measurement beams of the Z-interferometer $Z_{IF}$ are directed by 45°-mirrors 31 mounted on the sides of the wafer table WT. To ensure that the Z position of the substrate table can be measured throughout its range of movement in X, the mirrors 34, 35 have a correspondingly large extent in the X direction. To ensure the Z position can be measured throughout the range of Y-movement, the mirrors 31 cover the whole length of the wafer table. Also mounted to the metrology frame MF are the beam generating and receiving parts 21a, 22a of a confidence sensor 20a described further below.

At the measurement station(on the right in FIG. 8), the same metrology frame MF carries mirrors 33 and 32 which serve the same function as the mirrors 34, 35 at the exposure station; again mirrors 32, 33 will have a large extent in the X direction to accommodate the required range of movement of the substrate table WT which is just as large as that at the exposure station. Level sensor 10, comprising beam generating part 11 and detection part 12, is also mounted on the metrology frame MF. Additionally, a confidence sensor 20b, essentially the same as confidence sensor 20a at the exposure position, is provided. Other measurement devices, for example an alignment module, can also be provided.

As discussed above, the use of the physical reference surface (again in this embodiment this is provided by the upper surface of the TIS) relates the wafer height map to the wafer stage and makes it independent of the zero positions of the two Z-interferometers and certain local factors such as unflatness of the base plate (stone) BP over which the wafer tables move. However, since the wafer height map is generated using the Z-interferometer at the measurement station and the substrate table position is controlled at the exposure station using a different Z-interferometer provided there, any differences as a function of XY position between the two Z-interferometers can affect the accuracy with which the wafer surface is positioned in the focal plane. The principal cause of these variations in an interferometer system of the type used in the present invention is unflatness of the mirrors 32, 33, 34, 35. The 45° mirrors 31 are attached to the wafer table WT and travel with it as it swaps between exposure and measurement stations. Any unflatness of these mirrors therefore has largely the same effect on positioning at the exposure station as at the measurement station, and largely cancels out. However, the mirrors 32, 33, 34 and 35 mounted on the metrology frame MF stay with their respective interferometers and so any differences in the surface contours of the corresponding pairs 32, 34 and 33, 35 can adversely affect the vertical positioning accuracy of the substrate table WT.

The confidence sensors 20a and 20b are used at initial set-up of the apparatus, and periodically as required thereafter, to calibrate the differences between the Z-interferometers at the measurement and exposure stations. The confidence sensors are sensors capable of measuring the vertical position of the upper surface of the wafer at one or more points as the substrate table is scanned underneath it. Confidence sensors 20a and 20b can be similar in design to level sensor 10 but need not be; since they are used only at setup (and for infrequent recalibration) and with a reference wafer rather than production wafers, the design criteria are less onerous and advantage can be taken of this to design a simpler sensor. Conversely, the existence of the projection lens PL at the exposure station will restrict the physical locations available for the confidence sensor at that station, and this also needs to be taken into account in design or selection of each confidence sensor. High accuracy is required of the confidence sensors since the calibration they are used for will affect the quality of every exposure.

In the calibration process using the confidence sensor(s), a reference wafer is loaded onto the substrate table. The reference wafer is preferably a bare silicon wafer. There is no requirement for it to be any flatter than a normal bare Si wafer but its surface finish (in terms of reflectivity) is preferably optimized for the confidence sensors. In a preferred embodiment of the invention the reference wafer is preferably polished to maximize its reflectivity and minimize unflatness.

In the calibration procedure, a partial height map of the reference wafer (as usual referenced to the physical reference surface) is generated at the measurement station using the confidence sensor 20b instead of the level sensor 10. This is done in the same manner as with the level sensor 10: the physical reference surface (TIS) is positioned at the zero point of the confidence sensor to zero the Z-interferometer, the wafer is then scanned under the confidence sensor, and the height map, is generated from the difference between the confidence sensor and Z-interferometer readings. A height map is also generated at the exposure station using the confidence sensor 20a at the same points as the measurement station height map. For this calibration, the height maps need not be a complete scan of the wafer; they need only cover strips corresponding to the movement of the Z-interferometer beam over the mirrors 32–35. (The order in which the maps are created is not important, provided the wafer is stable on the substrate table while both are done.)

Since the height maps represent the same wafer, any differences between them will be caused by differences between the measurement systems used to create them. The two confidence sensors are static, so their effects on the height maps will not be position-dependent and can be eliminated by normalizing the two height maps and/or subtracting static offsets. Any remaining differences will be position-dependent, and the two height maps can be subtracted from one another to generate correction tables (mirror maps) that relates the exposure station Z-interferometer to the measurement station Z-interferometer. These correction tables can be attributed to the differences between the mirrors 33, 35 and 32, 34 attached to the metrology frame MF and can be applied to the wafer height maps generated in a production process, or used to correct one of the Z-interferometers used to generate the map or to position the substrate table during the exposure. Depending on the precise construction of the Z-interferometers, particularly the metrology frame mirrors and substrate table mirrors, the differences in Z position caused by the unflatnesses of the mirrors in each interferometer system may also be tilt dependent in one or more degrees of freedom (Rx, Ry, Rz). To eliminate this tilt dependence it may be necessary to use the confidence sensors to create several height maps with the wafer stage at various different tilts, from which a number of different correction tables (mirror maps) can be derived, as necessary.

Figure 9:
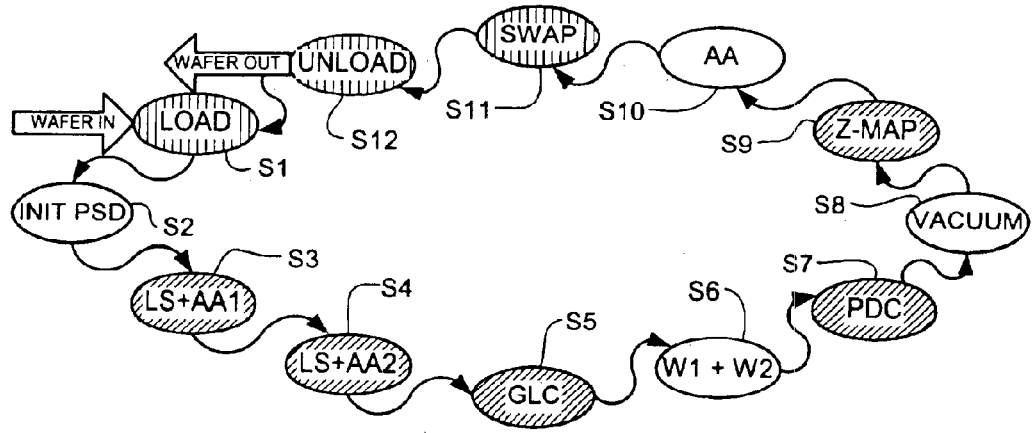
FIG. 9 is a flow diagram illustrating various steps of the measurement process carried out at the measurement station of the second embodiment of the invention.
Figure 10:
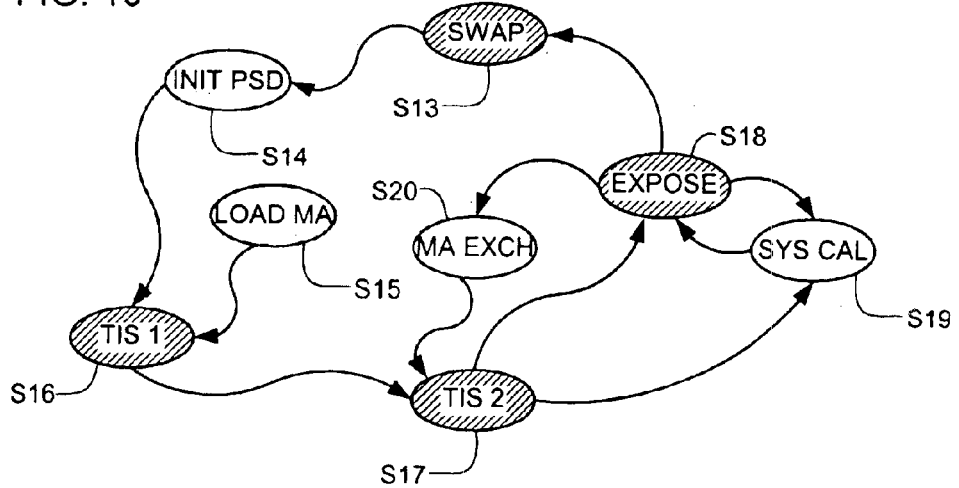
FIG. 10 is a flow diagram illustrating various steps of the exposure process carried out at the exposure station of the second embodiment of the present invention.

Having described the principle of the off-axis levelling procedure, now will be described some further refinements to it that are employed in the second embodiment, as well as how it is integrated into the production process. FIGS. 9 and 10 are referred to and respectively show the steps carried out at the measurement station and at the exposure station. In a lithography apparatus using two wafer tables, one table will be going through the steps of FIG. 9 while a second simultaneously goes through the steps of FIG. 10 before they are swapped. In the description below, the "life" of a single wafer is followed from measurement station (FIG. 9) to exposure station (FIG. 10) and back.

Starting at step S1 in FIG. 9, a wafer coated with a photosensitive resist is loaded on to the substrate table WT. (Note that this may generally take place at a loading station separate from the measurement station at which the substrate table is out of range of the interferometer system IF.) The wafer table is moved into the capture range(s) of one or more position sensitive devices (PSDs) so that an initial coarse zeroing of the interferometric metrology system can be performed, step S2. After the initial coarse zeroing, the fine initialization/zeroing of the interferometric system follows in steps S3 and S4. These two steps contain the level sensor measurements (denoted "LS") on the (two or more) physical reference surfaces, which will define the reference plane (fixed to the wafer table) with respect to which the wafer height map is measured. Also, two alignment measurements (denoted "AA") are done on markers located on the same physical reference surfaces, so as to define the horizontal reference positions fixed to the wafer table. These measurements in S3 and S4 effectively zero the interferometric system in all degrees of freedom.

The next step in the levelling procedure is step S5, referred to as the global level contour (GLC). In this step, which is described further below, a wafer capture and an initial scan of the wafer with the level sensor is made to determine its overall height and tilt as well as its approximate height at the points where the subsequent detailed scan will move onto or off the wafer. This information enables the substrate table trajectory for the wafer height map scan to be defined.

In step S6, a global alignment of the wafer is done. At least two alignment markers on the wafer are measured (W1 and W2), meaning that their XY position is determined with respect to the reference markers on the TIS fiducials. This determines to what extent the wafer is horizontally rotated (Rz) with respect to the scan direction (y), and is done to be able to correct the wafer rotation such that the wafer height map scans are done parallel to the exposure area axis (i.e. "going straight over the exposure areas").

After that, the levelling procedure continues with measurements necessary for a process dependent correction (PDC). A process dependent correction is necessary with some forms of level sensor, and will now be explained.

The wafer height map must be taken each time a wafer is exposed. If a wafer has already been subjected to one or more process steps, the surface layer will no longer be pure polished silicon and there may also be structures or topology representing the features already created on the wafer. Different surface layers and structures can affect the level sensor readings and in particular can alter its linearity. If the level sensor is optical, these effects may, for example, be due to diffraction effects caused by the surface structure or by wavelength dependence in the surface reflectivity, and cannot always be predicted. To determine the required process dependent correction, an exposure area or die is scanned under the level sensor with the substrate table WT set to several different vertical positions spanning the linear or linearized range of the level sensor 10. The wafer height, i.e. the physical distance between the wafer surface and the reference plane, should not change with the vertical position of the substrate table; it is obtained by subtracting the measurements of the level sensor and Z-interferometer: $Z_{WAFER}=Z_{LS}-Z_{IF}$. Therefore if the determined value of $Z_{WAFER}$ does change with vertical position of the substrate table this indicates that either or both the level sensor or Z-interferometer are not linear or not equally scaled. The Z-interferometer is deemed to be linear since it looks at the mirrors on the wafer table and metrology frame; and in fact is linear to a greater extent than the required accuracy for the wafer height map, at least once the correction determined by the use of the confidence sensor is applied. Therefore, any differences in the wafer height values are assumed to result from non-linearity or mis-scaling of the level sensor. They, and the knowledge of at which level sensor readings they were observed, can be used to correct the output of the level sensor. It has been found in a presently preferred embodiment of the level sensor that a simple gain correction is sufficient, but a more complex correction may be required for other sensors.

If the wafer to be processed has exposure areas on it that have been subjected to different processes, then a process-dependent correction is determined for each different type of exposure area on the wafer. Conversely, if a batch of wafers having exposure areas that have undergone the same or similar processes are to be exposed, it may only be necessary to measure the process-dependent correction for each type of exposure area once per batch. That correction can then be applied each time that type of exposure area is height-mapped in the batch.

In many IC fabs, the photosensitive resist is applied to the wafer immediately before it is loaded into the lithography apparatus. For this, and other, reasons, the wafer may be at a different temperature than the substrate table when it is loaded and clamped in place. When the wafer cools (or warms) to the same temperature as the substrate table, thermal stresses can be set up because the wafer is clamped very rigidly using vacuum suction. These may result in undesirable distortion of the wafer. Thermal equilibrium is likely to have been reached by the time the steps S2 to S7 have been completed. Therefore, at step S8, the vacuum clamping the wafer to the substrate table is released, to allow the thermal stresses in the wafer to relax, and then reapplied. This relaxation may cause small shifts in the position and/or tilt of the wafer but these are acceptable since steps S2 to S4 are independent of the wafer and S5 and S6 are only coarse measurements. Any shift in the wafer position at this stage does not affect the process-dependent correction since that is a calibration of the level sensor rather than a measurement of the wafer.

After the vacuum has been reapplied, and from here on it is not released again until the exposure process is finished, the Z-map is carried out at step S9. The scan required for the Z-map must measure the height of sufficient points to enable the wafer to be positioned during exposure at the desired accuracy. It is also important that the points measured cover the actual area where the wafer is to be exposed; measurements taken over non-exposure areas, such as scribe lanes and so-called mouse bites, may give misleading results. Accordingly, the height mapping scan must be optimized to the specific pattern of exposure areas on the wafer at hand; this is described further below.

Once the Z-map is completed, the advance alignment measurements, step S10, are carried out before the substrate table is swapped, at step S11, to the exposure position. In the advance alignment process, the positions of a number of alignment markers on the wafer relative to the reference markers F located on the TIS fiducial (physical reference surface) fixed to the substrate table are accurately determined. This process is not particularly relevant to the present invention and so is not described further herein.

In the swap procedure, the substrate table carrying the height-mapped wafer arrives at the exposure station, step S13 in FIG. 10. A coarse position determination of the substrate table is made at step S14 and, if necessary, a new mask MA is loaded onto the mask table MT, step S15. The mask loading process may be carried out, or at least begun, simultaneously with the substrate table swap. Once a mask is in position and a coarse position determination, step S14, has been made, a first TIS scan is carried out using sensor TIS1 at step S16. The TIS scan measures the vertical and horizontal position of the substrate table at which the TIS is located in the aerial image focus of the projection lens, as described above, yielding a focal plane reference. Since the height map generated as step S9 in FIG. 9 is referenced to the physical surface in which the TIS is located, the vertical positions of the substrate table necessary to put the wafer surface in the focal plane for the different exposure areas are directly derived. A second TIS scan, step S17, is also carried out using sensor TIS2, yielding a second point for referencing a focal plane.

Once the TIS scans have been completed and the focal plane determined, the exposure process S18 is carried out, optionally after any necessary system calibrations in step S19 (e.g. adjustments to correct for lens heating effects). The exposure process will generally involve the exposure of multiple exposure areas using one or more masks. Where multiple masks are used, after mask exchange S20, one TIS scan S17 can be repeated to update any focal plane changes. Between some or all exposures, the system calibration step S19 may also be repeated. After completion of all exposures, the substrate table carrying the exposed wafer is swapped at step S13 for the substrate table carrying the wafer that has meanwhile been undergoing steps S1 to S10 of FIG. 9. The substrate table carrying the exposed wafer is moved to the loading station and the exposed wafer taken out so that a fresh wafer can be loaded and the cycle can resume.

Figure 11:
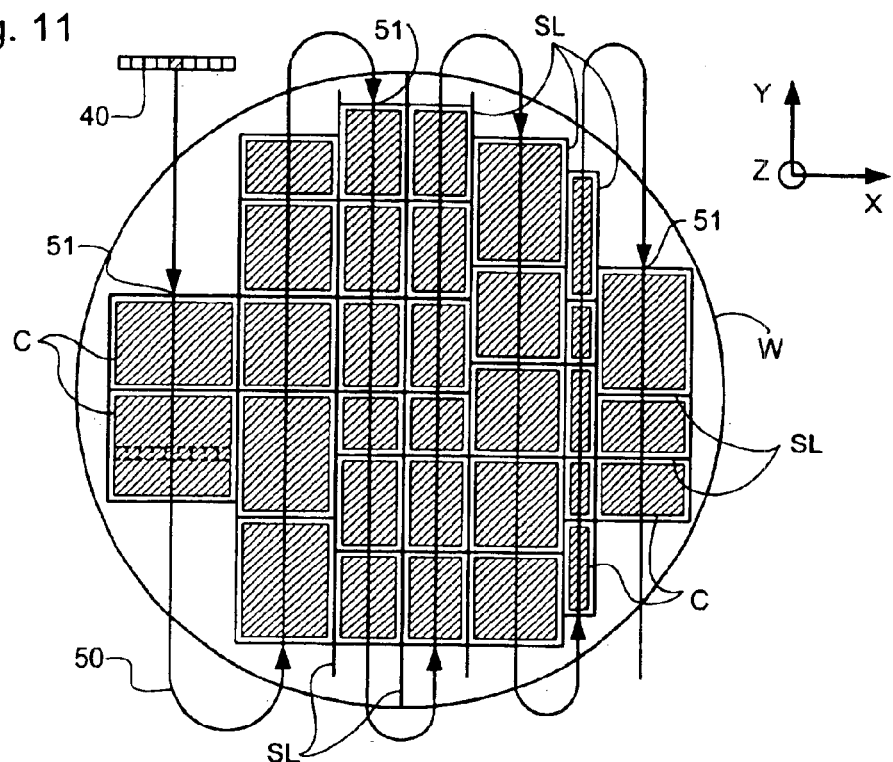
FIG. 11 is a diagram illustrating the scan pattern usable to measure the height map of the present invention.

To explain the wafer height mapping scan of step S9 of FIG. 9, FIG. 11, shows an example of a pattern of exposure areas C of various shapes and sizes arranged on a wafer to make best use of the silicon area. The different exposure areas C are separated by scribe lanes SL and generally-triangular unused areas, known as "mouse-bites" are inevitably left between the rectangular exposure areas and the curved edge of the wafer. The scribe lanes are where the wafer will be cut once all production processes have been completed (so as to separate the different devices) and some cutting techniques may require that the scribe lanes in one direction all span the entire width of the wafer; in that case it is convenient to orient these full wafer-width scribe lanes parallel to the scanning direction (e.g. the Y direction) if the apparatus is to be used in step-and-scan mode. The scribe lanes and mouse bites may not be exposed, and so after the wafer has been subjected to a few process steps or depositions of layers they may have very different heights and surface properties than the exposure areas C. Accordingly it is important to disregard any height measurements in these areas, which are not going to be exposed.

A presently preferred embodiment of the level sensor uses a linear array of, e.g., nine optical spots arranged perpendicular to the scanning direction to measure the height at nine points (areas) simultaneously. (Note that the Z-interferometer data can also be interpolated to provide corresponding Z-position data of the substrate table at an array of corresponding level sensor points.) The array of spots is of a size sufficient to cover the width of the widest exposure area that can be exposed in the apparatus.

The presently preferred scanning scheme is to scan the array of spots in a meander path 50 such that the center spot of the array passes along the midline of each column of exposure areas; this midline corresponds to the midline of the illuminated slit in the exposure process. The data thus generated can be directly related to the exposure scan with a minimum of rearrangement or calculation. This method also eliminates part of the mirror unflatness effect, since, at both measurement and exposure stations, scans are carried out with the Z-interferometer beam pointing at the same position on the mirrors 31 attached to the substrate table. If the column of dies is narrower than the array of spots of the level sensor, data obtained from the spots not lying wholly within the exposure area are ignored. In other embodiments of the level sensor it may be possible to adjust the width of the array of spots to match the width of the exposure areas.

Figure 12:
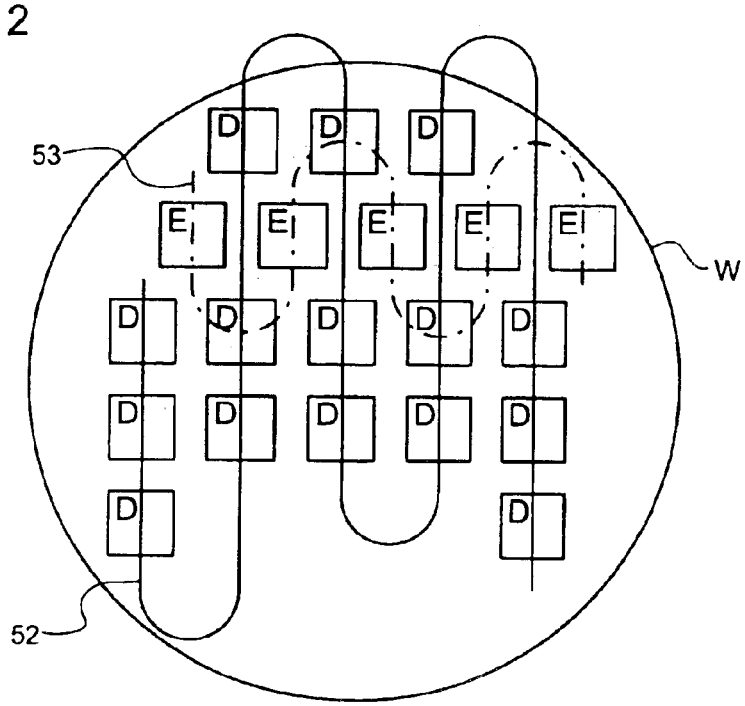
FIG. 12 is a diagram illustrating an alternative scan pattern usable to measure the height map of the present invention.

If a wafer has some exposure areas whose center lines are offset in the direction perpendicular to the scanning direction from those of the remainder, a modified scanning scheme may be used to advantage. This situation is illustrated in FIG. 12 which shows one row of dies E whose center lines are offset from the remaining dies D. In such a case, the map can be created more quickly and with fewer accelerations for the substrate table by scanning two meander paths. One path, referenced 52 in FIG. 12, covers one set of exposure areas D and the other, referenced 53, covers the others E. Of course, other arrangements of the exposure areas may require further modifications to the scanning scheme.

Where the level sensor has a limited linear or linearized range, which is likely the case, the substrate table WT must be scanned underneath it at a vertical position that brings the wafer surface into that range. Once the wafer surface has been found it is a simple matter, by means of a closed feedback loop of the level sensor reading to the substrate table positioning system, to adjust the vertical position of the substrate table WT to keep the wafer surface in the linear or linearized range but it is not so simple to find the wafer surface when the level sensor first moves onto an exposure area from outside the wafer. In a meander path there are several such in-points, referenced 51 and indicated by arrows on the meander path 50 in FIG. 11, compounding the problem.

To find the wafer surface at the in-points 51 it is possible to provide a capture spot in advance of the main level sensor spot array. The reflection of the capture spot on the wafer is then directed to a detector that has a wider capture range than is the case for the main spots. This, however, requires additional hardware: a capture spot on both sides of the main spots (before/after) or a restriction to scanning in only one direction. An alternative, not necessarily requiring additional hardware, is to stop the substrate table close to each in-point, perform a wafer capture and measure the wafer surface in the linear or linearized range of the level sensor to approximate the wafer surface position at the in-point. This however slows down the measurement procedure significantly, which may have undesirable consequences for throughput.

Figure 13:
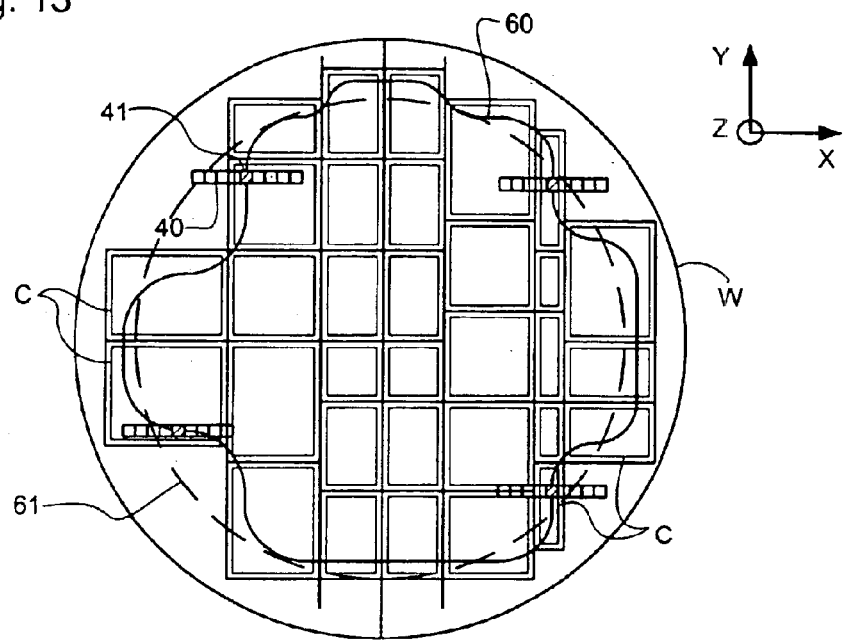
FIG. 13 is a diagram illustrating the global level contour process in the second embodiment of the present invention.

In this embodiment of the invention, these problems are avoided by performing a global level contour scan mentioned above (step S5 in FIG. 9) after the wafer surface is captured. The global level contour scan is explained further with reference to FIG. 13.

For the global level contour scan the substrate table is first positioned so that a convenient point (preferably near the edge) within an exposure area C is underneath a single capture spot and the main spots of the level sensor (spot array). The wafer surface is found, e.g. by scanning the substrate table vertically until the wafer surface is captured and comes within the linear or linearized range of the main spots, and then the substrate table is scanned so that the central spot 41 traverses a path 60 around the inside of the perimeter of the total exposure area. The capture procedure is described further below. Measurements of the wafer surface height are taken at defined positions around the scan. Where other spots of the array as well as the center spot fall over (exposure areas of) the wafer, the measurements from these spots, as well as the central one, can also be taken. However, measurements should not be taken from spots falling outside the exposure areas. As illustrated, the global level contour path 60 is a winding path following the edges of the exposure areas quite closely; however a smoother path may also be employed and, particularly when the wafer is well filled with exposure areas, a circular course 61 may well suffice and be more convenient. The global level contour may also be arranged as a circle passing over mouse bites, in which case measurements are not taken over the mouse bites, or the data of any measurements taken on mouse bites are disregarded in calculation of the global height and tilt of the wafer.

The data gathered in the global level contour scan are used for two purposes. Firstly data relating to the wafer height in the vicinity of the in-points 51 (see FIG. 11) of the height mapping scan to be carried out later are used to predict the wafer height at the in-points 51 so that the substrate table can be brought to the correct height to get the wafer surface position in the linear or linearized level sensor range during the mapping scan. In most cases only a few data points are required for this and they need not be particularly close to the in-points to allow a sufficiently accurate prediction of the wafer height to be determined by interpolation or extrapolation. It is also desirable to know the local Ry tilt at the in-points 51 for the height mapping scan, since the level sensor has an array of spots in the X-direction which (preferably) all need to be brought within their linear or linearized ranges. If the global level contour scan is parallel, or nearly parallel, to the Y direction in the vicinity of any in-point, the Ry tilt cannot be accurately determined using data obtained from only a single spot. Where a level sensor having an array of measurement spots spaced apart in the X direction, such as that described below, is used, data from multiple spots can be used to determine a local Ry tilt. Of course, data from spots lying within the exposure area are selected if part of the array falls outside that area.

The second use of the global level contour data is to determine a global, or average, height and tilt (around 2 axes) for the whole wafer. This is done by known mathematical techniques, e.g. a least-squares method, to determine a plane that most closely fits the wafer height data gathered. If the global tilt (sometimes referred to as the "wedge") is greater than a predetermined amount, this may well indicate an incorrect loading procedure. In that case the wafer can be unloaded and reloaded for a retry and even rejected if it continues to fail. The global height and tilt information is used to focus an advance alignment sensor used in step S10 of FIG. 9 to accurately determine the spatial relationship of alignment markers on the wafer to reference markers on the substrate stage. The advance alignment sensor and process are described in greater detail in WO 98/39689 (P-0070).

During a wafermap scan, the level sensor 10 provides continuous Z and Ry feedback signals to the substrate table to keep the level sensor 10 in its linear or linearized range. If this feedback loop stops (the level sensor 10 doesn't supply correct numbers) the table is controlled by following a path corresponding to the global wafer wedge (a Z profile according to global Rx).

A presently preferred embodiment of the level sensor 10 is illustrated in FIG. 14 and will be explained below additionally with reference to FIGS. 14A to 14G, which show aspects of the operation of the sensor.

Level sensor 10 comprises a beam generation branch 11 which directs a measurement beam $b_{LS}$ onto the wafer W (or the physical reference plane when the vertical position of that is being measured, or any reflecting surface) and a detection branch 12 which measures the position of the reflected beam, which is dependent on the vertical position of the wafer surface.

In the beam generation branch, the measurement beam is generated by light source 111, which may be an array of light emitting or laser diodes, or generated elsewhere and passed to "illuminator" 111 by optical fibers. The beam emitted by light source 111 preferably contains a wide band of wavelengths, e.g. from about 600 to 1050 nm, so as to average out any wavelength dependence of interference effects from the wafer surface, particularly after some process steps have been completed. Illumination optics 112, which may include any suitable combination of lenses and mirrors, collect the light emitted by light source 111 and evenly illuminate projection grating 113. Projection grating 113 is shown in greater detail in FIG. 14A and consists of an elongate grating 113a, which may be divided to generate an array of separate/discrete spots, with grating lines parallel to its axis, and an additional aperture 113b which forms a capture spot ahead of the main detection spot array on the wafer. The period of the grating will be determined in part by the accuracy at which the wafer surface position is to be measured and may, for example be about 30 μm. The projection grating is positioned with a small rotation around its optical axis such that the grating lines projected on the wafer are not parallel to any wafer coordinate axis, thereby to avoid interference with structures on the wafer which are along the x or y direction. Projection lens 114 is a telecentric system which projects an image of the projection grating 113 onto the wafer W. Projection lens 114 preferably consists essentially or only of reflecting optical elements so as to minimize or avoid chromatic aberration in the projected image; since the projection beam is broadband these cannot easily be eliminated or compensated for in a refractive optical system. Folding mirrors 115, 116 are used to bring the projection beam $b_{LS}$ into and out of the projection lens 114 and permit a convenient arrangement of the components of the beam generation branch.

The projection beam $b_{LS}$ is incident on the wafer at a fairly large angle, α, to the normal, e.g. in the range of from 60° to 80°, and is reflected into the detection branch 12. As shown in FIG. 14B, if the wafer surface WS shifts in position by a distance Δh to position WS', then the reflected beam r' will be shifted relative to the beam r, prior to the shift in the wafer surface, by a distance 2.Δh.sin(α). FIG. 14B also shows the appearance of the image on the wafer surface; because of the large angle of incidence, the image is spread out perpendicular to the grating lines.

The reflected beam is collected by detection optics 121 and focused on detection grating 126, which is essentially a copy of projection grating 113 and is sub-divided to correspond to the spot-array pattern. Detection optics 121 are directly complementary to projection optics 114 and will also consist essentially or only of reflective elements, to minimize chromatic aberration. Again folding mirrors 122, 123 may be used to enable a convenient arrangement of the components. Between detection optics 121 and the detection grating 126 are positioned a linear polarizer 124 to polarize the light at 45° and a birefringent crystal 125 which causes a shear perpendicular to the grating lines equal in magnitude to the grating period between the horizontal and vertical polarized components of the light. FIG. 14C shows the beam as it would be at the detection grating 126 without the birefringent crystal; it is a series of alternating light and dark bands with the light bands polarized at 45°. The birefringent crystal 125 shifts the horizontal and vertical polarization states so that the light bands of the horizontal polarization component fill the dark bands of the vertical polarization component. As shown in FIG. 14D, the illumination at the detection grating 126 is therefore uniform grey but has stripes of alternating polarization state. FIG. 14E shows the detection grating 126 overlaid on this pattern, which depends on the vertical position of the wafer surface; when the wafer is at a nominal zero vertical position, the detection grating 126 will overly and block half of the light bands of one polarization state, e.g. the vertical, and half of the other state.

The light passed by the detection grating 126 is collected by modulation optics 127 and focused on detector 128. Modulation optics include an polarization modulation device driven by an alternating signal, e.g. with a frequency of about 50 kHz, so as to pass the two polarization states alternately. The image seen by the detector 128 therefore alternates between the two states shown in FIG. 14F. Detector 128 is divided into a number of regions corresponding to the array of spots whose height is to be measured. The output of a region of detector 128 is shown in FIG. 14G. It is an alternating signal with period equal to that of the modulating optics and the amplitude of the oscillations indicates the degree of alignment of the reflected image of the projection grating on the detection grating, and hence the vertical position of the wafer surface. As mentioned above, if the wafer surface is at the nominal zero position, the detection grating 126 will block out half of the vertical polarization state and half of the horizontal polarization state so that the measured intensities are equal and the amplitude of the oscillating signals output by the detector regions will be zero. As the vertical position of the wafer surface moves away from the zero position, the detection grating 126 will begin to pass more of the horizontally polarized bands and block more of the vertically polarized bands. The amplitude of the oscillations will then increase. The amplitude of the oscillations, which is a measure of the vertical position of the wafer surface, is not directly linearly related to the vertical position of the wafer surface in nanometers. However, a correction table or formula can readily be determined on initial setup of the apparatus (and periodically recalibrated if necessary) by measuring the constant height of the surface of a bare silicon wafer at various different vertical positions of the substrate table, using the calibrated Z-interferometer and uncalibrated level sensor 10.

To ensure that the measurements of the level sensor and the Z-interferometer are taken simultaneously, a synchronization bus is provided. The synchronization bus carries clock signals of a very stable frequency generated by a master clock of the apparatus. Both the level sensor and Z-interferometer are connected to the synchronization bus and use the clock signals from the bus to, determine sampling points of their detectors.

Figure 15:
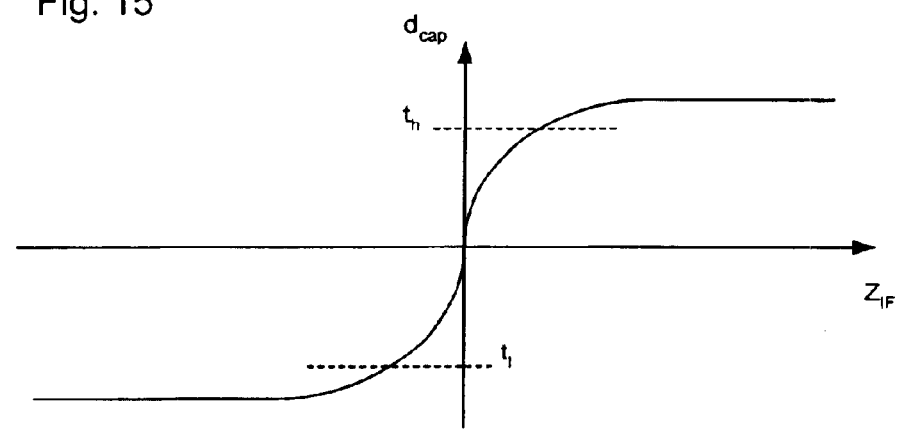
FIG. 15 is a graph showing detector output vs. substrate table position for a capture spot of the level sensor of FIG. 14.
Figure 15A:
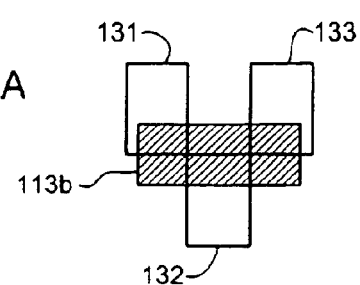
FIG. 15A is a diagram showing the arrangements of detector segments for the capture spot of the level sensor of FIG. 14.

The capture spot 113b passed by the projection grating 113 passes the detection grating, where it is incident on three separate detection regions, two 131, 133 set high and one 132 set low, as shown in FIG. 15A. The output from the low detection region is subtracted from those of the high regions. The capture spot detector regions are arranged so that when the wafer surface is at the zero position, the capture spot falls equally on the high and low detection regions and the subtracted output is zero. Away from the zero position, more of the capture spot will fall on one of the detection regions than the other and the subtracted output will increase in magnitude with its sign indicating whether the wafer is too high or too low. The dependence of the subtracted detector output $d_{cap}$ on substrate table position $Z_{IF}$ is illustrated in FIG. 15. This form of detector output allows a faster zero capture method than a conventional servo feedback. According to the improved method, referred to as "move-until", when the capture spot detector indicates that the wafer surface is too high or too low, the Z-position actuators of the substrate table are instructed to move the stage in the appropriate direction to bring the wafer surface into the linear or linearized range of the main level sensor array. The movement of the wafer stage continues until the output of the capture spot detector $d_{cap}$ passes a trigger level $t_h$ or $t_l$ according to which direction it is traveling. Crossing the trigger level causes the apparatus control to issue a command to the Z-position actuators to begin a braking procedure. The trigger levels are set so that, in the response time and the time taken to brake the stage motion, the stage will move to, or close to, the zero position. Thereafter the stage can be brought to the zero position under control of the more accurate main level sensor spots. The trigger points will be determined in accordance with the dynamics of the stage and need not be symmetrically spaced about zero detector output. This "move-until" control strategy enables a rapid and robust zero capture without requiring a linear measurement system, and can be used in other situations.

The level sensor described above can be further optimized to improve its performance. Improvement in accuracy in the scan (Y) direction can be effected by appropriate signal filtering and this may be adapted to specific process layers observed on partly processed wafers. Additional improvements (for specific process layers) in all directions may be obtained by optimization of the measurement spot geometry, which can be adjusted by changing the illumination optics 112 (to adjust the uniformity and/or angular distribution of the illumination light on the projection grating 113), by changing the projection grating 113 or by adjusting the detection system (size, position and/or angular resolution of the detector and the number of detectors).

Figure 16:
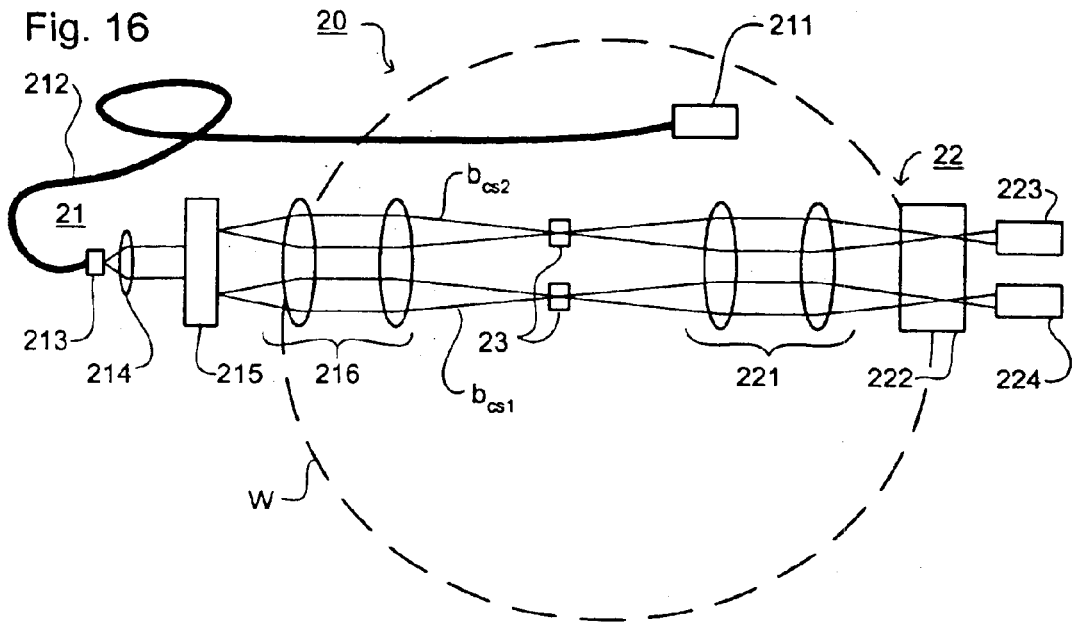
FIGS. 16 and 17 are diagrams illustrating a presently preferred embodiment of a confidence sensor usable in the second embodiment of the invention.
Figure 17:
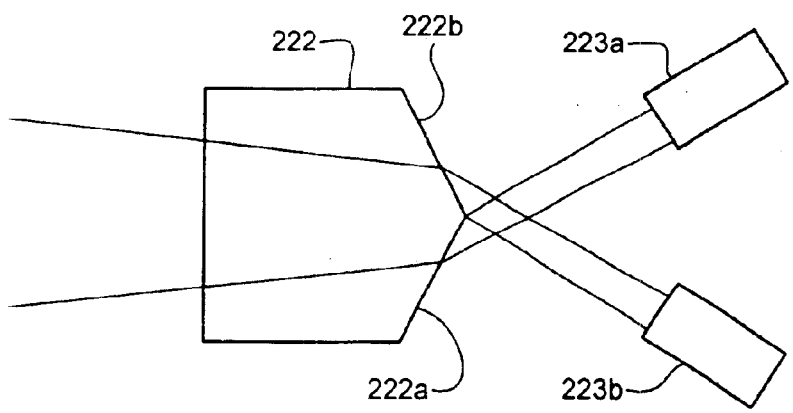

A presently preferred form of the confidence sensors 20a, 20b is illustrated in FIGS. 16 and 17. The beam generation branch 21 comprises a light source 211 (e.g. a solid state laser diode or super-luminescent diode) which emits light of limited bandwidth. It is conveniently situated away from the metrology frame and its output brought to the desired point by an optical fiber 212. The light is output from fiber terminator 213 and directed onto a beam splitter 215 by collimating optics 214. Beam splitter 215 creates two parallel measurement beams $b_{cs1}$ and $b_{cs2}$ which are focused to evenly illuminate respective spots 23 on the wafer W by telecentric projection optics 216. Since the measurement beams of the confidence sensor have a limited bandwidth, projection optics 216 can conveniently employ refractive elements. Detection optics 221 collect the reflected beams and focus them at the edge of detection prism 222 which is positioned between detectors 223, 224 and detection optics 221. As shown in FIG. 17, which is a side view of detection prism 222 and detector 223, a measurement beam is incident on the back of detection prism 222 and exits through angled faces 222a, 222b. Detector 223 consists of two detector elements 223a, 223b positioned so that light emerging from face 222a of detection prism 222 reaches detector element 223a and that emerging from face 222b reaches detector element 223b. Detector 224 is similar. Outputs of detector elements 223a and 223b are intensity-scaled and subtracted. When the wafer surface is at the zero position, the measurement beam falls symmetrically on faces 222a, 222b of detection prism 222 and equal amounts of light will be directed to detector elements 223a and 223b. These will then give equal outputs and so the subtracted output will be zero. As the wafer surface moves away from the zero position, the position of the reflected beam will move up or down and fall more on one of faces 222a, 222b than on the other resulting in more light being directed to the respective detector element so that the subtracted output will change proportionally. A tilt of the wafer can be determined by comparison of the outputs of detectors 223 and 224.

This arrangement provides a simple and robust height and level detector that can be used as the confidence sensor in the second embodiment of the present invention as well as in other applications. The confidence sensor is primarily intended for initial set up and periodic, e.g. monthly, recalibration of the Z-interferometers of the measurement and exposure stations. However, the confidence sensor described above has a wider capture zone and more rapid response than the TIS used for precise determination of the position of the focal plane of the projection lens PL relative to substrate table WT. Accordingly, the confidence sensor 20a can advantageously be used, when the substrate table is first swapped to the exposure station, to make a coarse determination of the vertical position of the TIS. The height measured by the confidence sensor is related to previously measured best focus position(s) and used to predict a starting point and range for the TIS scan near the expected position of the best focal plane. This means that the TIS scan, described above, can be made shorter and hence quicker, improving throughput.

Figure 18:
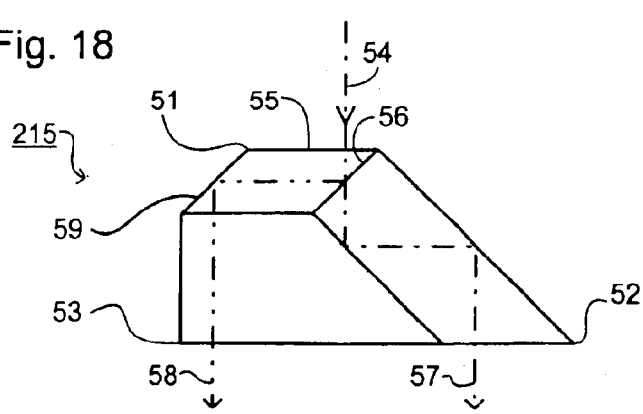
FIG. 18 is a diagram of a beam splitter usable in the confidence sensor of FIGS. 16 and 17.

A beam splitter 215 that can be used in the confidence sensors is shown in FIG. 18. A beam splitter is composed of a number of prisms which are made from the same glass and are preferably of equal thickness. The basic operation principle is described using a beam splitter consisting of 3 prisms 51, 52, 53. The first prism 51 is trapezoidal in cross-section and the input beam 54 is incident normally on its top face 55 near one side. The position of the input beam 54 is such that it meets one side face 56 of the first prism 51 which is at 45° to the top face 55. The second prism 52 is joined onto the side face 56 of first prism 51 and the join is coated so that a desired proportion of the input beam (half in the present embodiment) continues into the second prism 52 to form beam 57 while the remainder is reflected horizontally within the first prism 51 to form beam 58. Beam 58 reflected in the first prism 51 meets the second side face 59 of that prism, which is parallel to the first side face 56 and is reflected downwards out of the lower face of the first prism 51 and through top and bottom faces of third prism 53 which are parallel to top face 55 of first prism 51. The second side face 59 may be coated as necessary to ensure total internal reflection of beam 58. The beam 57, which passed into the second prism 52, is reflected internally by two parallel faces of the second prism 52, which are perpendicular to the side face 56 of the first prism 51, and emerges from the bottom face of the second prism 52 which is parallel to the top face 55 of first prism 51. Beams 57 and 58 are thereby output in parallel, but are offset. The separation between the beams 57, 58 is determined by the sizes of the prisms 51 and 52. Prism 53 is provided to equalize the optical path lengths of beams 57, 58 so that the imaging optics for both beams can be identical. Prism 53 also supports prism 52 as illustrated but this may not be necessary in some applications. To enhance the reflection of the beam 57 at the surface where prisms 52 and 53 meet, a void may be left or a suitable coating provided.

The beam splitter 50 is simple, robust and easy to construct. It provides output beams in parallel (whereas a conventional cubic beam splitter provides perpendicular beams) and with equal path length. The splitting surface can be made polarization selective or not, and in the latter case can divide the input beam intensity evenly or unevenly as desired.

It is a feature of the level and confidence sensors described above, as well as other optical height sensors, that they are insensitive to tilt of the wafer stage about an axis perpendicular to the Z-direction defined by the intersection of the wafer surface WS and the focus plane of the measurement spot of the level sensor 10. This is due to the fact that the sensors measure a height over the area of the measurement spot extrapolated to the spot's focus axis. The tilt insensitivity can be used to calibrate the Z-interferometers and the optical sensors towards each other in the XY plane. The procedure for such calibration is described with reference to FIG. 19 and the level sensor, but a similar procedure can be used with the confidence sensor or any other similar optical sensor.

Figure 19:
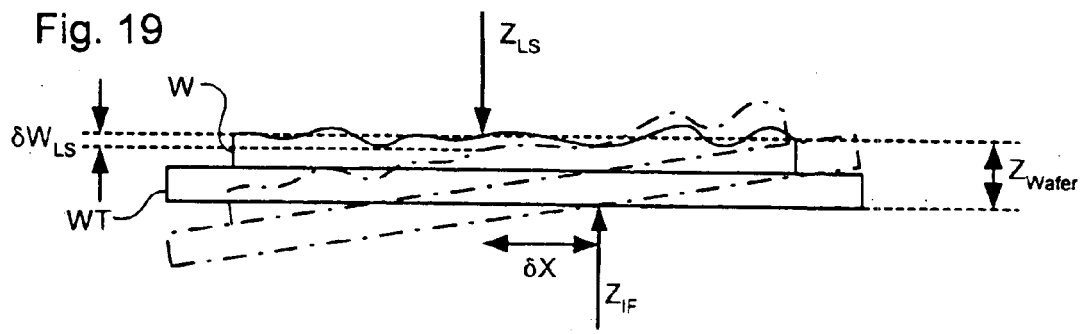
FIG. 19 is a diagram used to explain a Z-interferometer calibration procedure usable in embodiments of the invention.

The positioning system of the substrate table is linked to the multi-axis interferometer system of which the Z-interferometer is a part, and can be set to apply a rotation about a selected axis in the XY plane using spaced-apart Z-actuators. To align the Z-interferometer measurement position with the level sensor measurement spot, the positioning system is used to rotate the stage about an axis passing through the Z-interferometer measurement position and parallel to, for example, the Y axis. The Z position of the table as measured by the Z-interferometer will remain unchanged during this tilt. If the level sensor and Z-interferometer are exactly aligned, then the wafer surface position will also remain unchanged. However, if the level sensor measurement position is offset from the Z-interferometer position by an amount δX, as shown in FIG. 19, then tilting the substrate table WT to the position shown in phantom in that Figure will cause a change $\delta W_{LS}$ in the level sensor output. The offset δX, and the offset δY in the Y direction, can therefore be quickly determined by detecting any change in level sensor output with tilts about two, preferably perpendicular, axes passing through the Z-interferometer position. The parameters of the interferometer system or the level sensor 10 can then be adjusted to ensure that the Z-interferometer measurement position is exactly opposite the level sensor measurement position.

Where the level sensor uses an array of measurement spots, it cannot always be ensured that the spots are exactly aligned. The above technique can therefore be used to determine any offsets of the individual spots from the nominal position with respect to the Z-interferometer position. This information can then be used to correct the height map or the level sensor output.

EMBODIMENT 3

The third embodiment employs the levelling principle of the first embodiment and is the same as that embodiment except as described below. The third embodiment may also make use of the hardware and refinements of the second embodiment, described above. However, the third embodiment makes use of an improved method for optimization of the exposure path. This is explained below with reference to FIG. 20.

As discussed above, it is convenient and valid to consider that the substrate stage is stationary and that the exposure slit image moves, even though in practice it is the wafer that moves. The explanation below is given from this view point.

Figure 20:
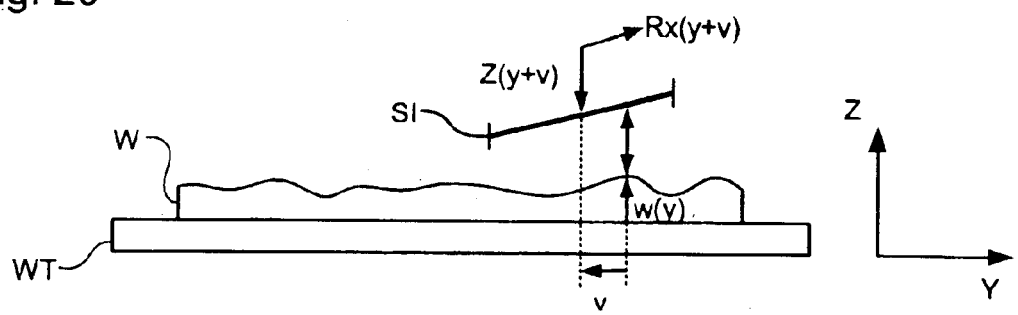
FIG. 20 is a diagram illustrating the notation used in describing an exposure trajectory optimization procedure according to a third embodiment of the invention.

FIG. 20 illustrates the notations used below. It should be noted that, although the slit image SI is depicted for clarity in FIG. 20 spaced from the wafer surface, the aim of the optimization procedure is to ensure that during an exposure the focus plane of the slit image coincides as far as possible to the wafer surface. Considering a one dimensional wafer whose surface is defined by w(y) and a slit image SI, the moving average (over time) defocus MA(y) corresponding to a coordinate on the wafer can be calculated from:

$$MA(y) = \frac{1}{s} \int_{-s/2}^{s/2} [w(y) - [z(y+v) - v \cdot Rx(y+v)]] \cdot dv \quad (2)$$

where the integral is taken over the slit size, s, in the scan direction and the integrand w(y)−[z(y+v)−v.Rx(y+v)] is the focus error on a point of the wafer at a certain moment in time. Similarly, the moving standard deviation for a point on the wafer can be defined as:

$$MSD^2(y) = \frac{1}{s} \int_{-s/2}^{s/2} [w(y) - [z(y+v) - v \cdot Rx(y+v)] - MA(y)]^2 dv \quad (3)$$

which is the defocus variation in time during the actual exposure of that point on the wafer. To minimize the difference between the plane of the exposure slit image and the wafer, a quadratic defocus term is used, defined as follows:

$$MF^2(y) = \frac{1}{s} \int_{-s/2}^{s/2} [w(y) - [z(y+v) - v \cdot Rx(y+v)] - MA(y)]^2 dv \quad (4)$$

where MF(y) is called the moving focus. It will be seen that MF(y) can also be written in terms of MA(y) and MSD(y) as follows:

$$MF^2(y) = MA^2(y) + MSD^2(y) \quad (5)$$

This means that in the optimization of the exposure path and minimisation of the moving focus over the exposure area, both the moving average and the moving standard deviation are taken into account, in contrast to the simpler least-squares optimization of the first embodiment, which neglects any time, and thus scanning, integration. Equations [3] and [4] can easily be extended to two dimensions by adding Ry(t) dependency and integrating MF over X from −W/2 to +W/2, where W is the width of the slit in the X-direction. To calculate the optimization it is convenient to use a frequency domain representation. Calculation in the frequency domain also enables high-frequency variations in the setpoints, that would result in excessive substrate stage accelerations in any or all of the degrees of freedom, to be filtered out, such that the exposure path is optimized for the performance of the substrate table positioning system.

In the above discussion, the optimum focus of the exposure slit image is assumed to conform to a plane; however, this is not necessarily the case: the optimum focus may in fact lie on an arbitrary surface, resulting in a so-called focal plane deviation (FPD). If the contour of that surface over the exposure slit area can be measured using the TIS to create a focus map f(x,y), or calculated, then the resulting data or equations can be added to the equations above so that the wafer motion is optimized for the actual optimum focal surface.

The optimization technique of the third embodiment can result in better focus for scanning systems and smoother substrate stage trajectories, increasing throughput and yield.

EMBODIMENT 4

In a fourth embodiment, the level sensor is provided with additional features to counteract errors in the measurement of the wafer surface position that may be caused by interference between the beam reflected by the top surface of the resist layer and the beam refracted into the resist layer and reflected by its bottom surface. Otherwise, the fourth embodiment may be the same as any of the first to third embodiments described above.

The interference of beams reflected from said top and bottom surface is largely dependent on the resist properties and wafer surface properties, as well as on the optical wavelength and angle of incidence of the measurement beam. Broadband light sources and detectors are currently used to average out such single-wavelength interference effects. Improvement of this averaging principle can be realized if the wafer surface position is measured in a spectrally resolved manner, whereby a distinct measurement is performed for a number of wavelengths in the broadband measurement beam. To achieve this, it is necessary to make a temporally or spatially separated wavelength (color) system for measuring the wafer surface position. This necessitates changes such as the following to the level sensor's measurement principle.

A first possible change to the level sensor is to replace the continuous broadband light source by one capable of selectively generating light beams of different wavelength ranges (colors). This can, for example, be achieved by selectively interposing different color filters (e.g. on a carousel) at a suitable point in the level sensor's illumination system, by the use of several independently selectable light sources, by using a wavelength-tunable light source, or by using a selected beam portion from a rotating/vibrating prism located in a small broadband beam. The level sensor is then used to take several measurements of the wafer surface at each point, using different wavelengths of light in the measurement beam.

Another option is to replace the broadband detector by one capable of selectively detecting light of different wavelength ranges (colors). This can be achieved, for example, by placement of color filters in the detection optics before the detector, by spatially splitting the measurement beam for different wavelengths using a prism and then detecting the different-wavelength beams on separate detectors, or by any other way of spectrally analyzing the broadband-reflected beam to measure the wafer surface position.

Naturally, it is also possible to use a combined approach, whereby both the projection system and the detection system are adapted to achieve spectral resolution.

In the absence of interference effects, each measurement (for each wavelength) should give the same result; consequently, if different results are obtained in such measurements, this indicates the presence of effects as referred to in the first paragraph above. An improved wafer surface position measurement can then be derived using a variety of techniques. For example, discrepant results may be corrected or discarded. Majority voting techniques may also be used. Alternatively, on the basis of a spectral measurement of the wafer surface position, one might even derive real positions by means of a model describing the spectral response of the resist and the wafer surface properties.

Since the described interference effect also depends on the angle of incidence of the measurement beam on the wafer surface, one might also want to vary this angle of incidence so as to evaluate the effect and then correct it. Accordingly, a further possible change to the level sensor is to adapt it such that the wafer surface position can be made using measurement beams at different angles of incidence. One way to achieve this is to define multiple measurement beams having different angles of incidence for the same spot on the wafer, but separate projection and detection optics systems. Alternatively, one can change the optical system so that the same projection and detection systems encompass the different optical axes pertaining to the various measurement beams. Another option, which generates temporally varying angles of incidence, is to use rotating/translating folding mirrors (or other movable components) in the optical systems of the level sensor.

As with the wavelength dependence described above, in the absence of interference effects, measurements at different angles of incidence should give the same result. Therefore, any discrepancies (variation with angle of incidence) can be avoided, compensated for, or modeled in the same way.

The above-mentioned additional features and improvements may, of course, be used together or separately, and in other optical sensors than those described here.

EMBODIMENT 5

Figure 21:
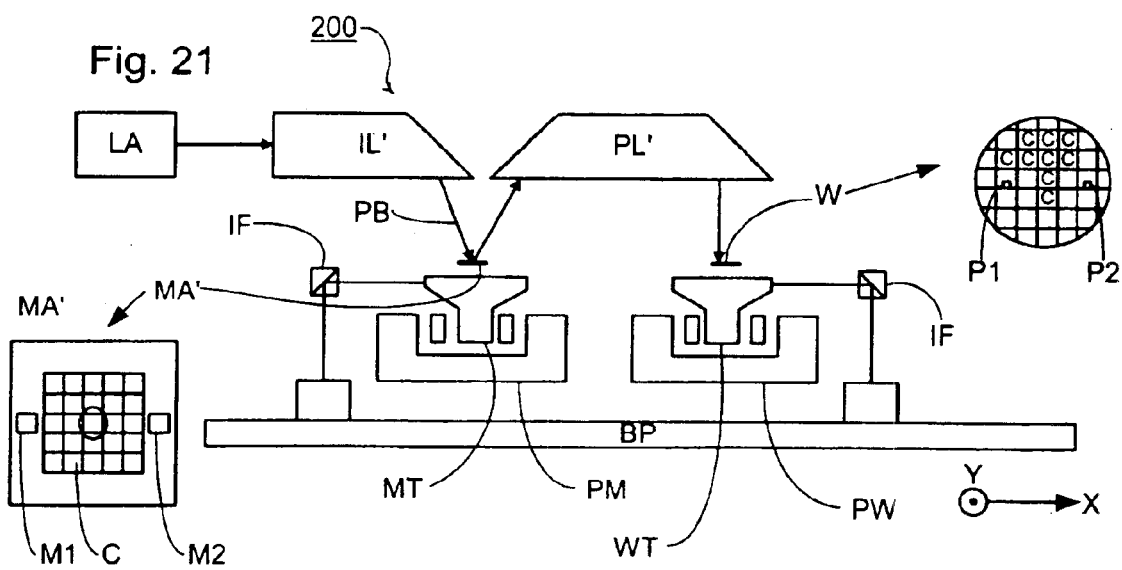
FIG. 21 depicts a lithographic projection apparatus according to a fifth embodiment of the invention.

A fifth embodiment of the invention is shown in FIG. 21. The fifth embodiment of the invention is a lithography apparatus employing, as the exposure radiation, extreme ultraviolet (EUV) radiation, e.g. of wavelength in the range of 9 to 16 nm, and a reflective mask MA'. Functionally at least, the components of the fifth embodiment are generally the same as those of the first embodiment but they are adapted to the exposure radiation wavelength used and their arrangement is adjusted to accommodate the beam path necessitated by the use of a reflective mask. Particular adaptions that may be necessary include optimizing the illumination and projection optics IL', PL' to the wavelength of the exposure radiation; this will generally involve the use of reflective rather than refractive optical elements. An example of an illumination optical system IL' for use with EUV radiation is described in European Patent Application 00300784.6 (P-0129).

An important difference between lithography apparatus using reflective masks and those using transmissive masks, is that with the reflective mask, unflatness of the mask results in position errors on the wafer that are multiplied by the optical path length of the downstream optical system, i.e. the projection lens PL'. This is because height and/or tilt deviations of the mask locally change the effective angle of incidence of the illumination beam on the mask and hence change the XY position of the image features on the wafer.

According to the fifth embodiment of the invention, the effects of unflatness of the mask are avoided or alleviated by making a height map of the mask in advance of the exposure and controlling the mask position in at least one of Z, Rx and Ry during the exposure. The height map can be generated in a similar manner to that described above (i.e. off-axis levelling of the mask at a measurement station); however, it may also be generated with the mask at the exposure station, which may obviate the need to relate the height map to a physical reference surface. The calculation of the optimum position(s) of the mask during the exposure or exposure scan (the exposure path) can be equivalent to that described above, but it may also be a coupled optimization of wafer and mask exposure paths. However, for a mask, it may be advantageous to place greater weight in the optimization calculations on tilt deviations, since these will have a greater effect on the position at the wafer.

It should be explicitly noted that a lithographic projection apparatus according to the current invention may contain two (or more) substrate tables and/or two (or more) mask tables. In such a scenario, it is possible for a first substrate on a first substrate table to be undergoing height-mapping at the measurement station while a second substrate on a second substrate table is concurrently undergoing exposure at the exposure station; and similarly in the case of multiple mask tables. Such a construction can greatly increase throughput.

It should also be explicitly noted that the current invention can be applied to substrate leveling alone, to mask leveling alone, or to a combination of substrate leveling and mask leveling.

While we have described above specific embodiments of the invention it will be appreciated that the invention may be practiced otherwise than as described. The description is not intended to limit the invention.

What is claimed:

1. A method of calibrating a lithographic projection apparatus comprising:
   generating a first height map of a substrate by measuring a position in a first direction substantially perpendicular to a surface of said substrate of a plurality of points on said substrate surface and simultaneously measuring a position of a substrate holder using a first position detection system, at a measurement station of a lithographic system;
   generating a second height map of said substrate by measuring a position in said first direction of said plurality of points on said substrate surface and simultaneously measuring a position of said substrate holder using a second position detection system, at an exposure station of the lithographic system; and
   comparing said first and second height maps to calibrate said first and second position detection systems.

2. A method according to claim 1, wherein the substrate is a bare silicon wafer.

3. A method according to claim 2, wherein said bare silicon wafer has a surface that is polished.

4. A method according to claim 1, wherein the first and second height maps of said substrate are generated only for strips of the substrate surface which correspond to the measurement ranges of the first and second position detection systems.

5. A method according to claim 1, wherein comparing the first and second height maps comprises determining the difference between the first and second height maps, and storing resulting correction values.

6. A method according to claim 5, wherein the correction values are applied to substrate height maps generated during subsequent production processes.

7. A method according to claim 5, wherein the correction values are used to correct the position detection systems.

8. A method according to claim 1, wherein the first and second height maps are normalised.

9. A method according to claim 1, further comprising:
   determining static offsets between the first and second height maps; and
   removing said static offsets.

10. A method according to claim 1, further comprising:
    repeating a plurality of times said generating a first height map of said substrate, said generating a second height map, and said comparing said first and second height maps,
    wherein a different tilt is applied to said substrate holder for each repetition.

* * * * *